(12) United States Patent
Shimazumi et al.

(10) Patent No.: US 11,541,640 B2
(45) Date of Patent: Jan. 3, 2023

(54) CIRCUIT-INCLUDING FILM

(71) Applicant: KURARAY EUROPE GMBH, Hattersheim (DE)

(72) Inventors: Yuhi Shimazumi, Okayama (JP); Koichiro Isoue, Okayama (JP); Jun Koishikawa, Tokyo (JP)

(73) Assignee: Kuraray Europe GmbH, Hattershein (DE)

( * ) Notice: Subject to any disclaimer, the term of this patent is extended or adjusted under 35 U.S.C. 154(b) by 142 days.

(21) Appl. No.: 15/733,321

(22) PCT Filed: Dec. 27, 2018

(86) PCT No.: PCT/JP2018/048332
§ 371 (c)(1),
(2) Date: Jun. 25, 2020

(87) PCT Pub. No.: WO2019/131948
PCT Pub. Date: Jul. 4, 2019

(65) Prior Publication Data
US 2021/0114351 A1    Apr. 22, 2021

(30) Foreign Application Priority Data
Dec. 28, 2017  (JP) .............................. JP2017-254067

(51) Int. Cl.
*H05K 1/02*    (2006.01)
*B32B 17/10*   (2006.01)
(Continued)

(52) U.S. Cl.
CPC ........ *B32B 17/10036* (2013.01); *B32B 15/09* (2013.01); *B32B 15/20* (2013.01);
(Continued)

(58) Field of Classification Search
CPC ............... H05K 1/0212; H05K 1/0296; H05K 1/0326
See application file for complete search history.

(56) References Cited

U.S. PATENT DOCUMENTS 6,660,968 B1   12/2003   Mottelet et al.
2007/0108175 A1  5/2007  Andrt
(Continued)

FOREIGN PATENT DOCUMENTS

EP   1235683 B1   8/2003
EP   1606325 A1   12/2005
(Continued)

OTHER PUBLICATIONS

International Patent Application No. PCT/JP2018/048332; Int'l Search Report; dated Mar. 5, 2019; 2 pages.
(Continued)

*Primary Examiner* — Jeremy C Norris
(74) *Attorney, Agent, or Firm* — BakerHostetler

(57) ABSTRACT

A circuit-including film comprising: a resin film (1); and a conductive fine wire circuit (A) and a conductive circuit (B) independent of the conductive fine wire circuit (A), which are arranged on one surface of the resin film (1), wherein the resin film (1) contains at least one resin selected from the group consisting of a polyvinyl acetal resin, an ionomer resin and an ethylene-(vinyl acetate) copolymer resin.

17 Claims, 4 Drawing Sheets

(51) Int. Cl.
  *B32B 15/09* (2006.01)
  *B32B 15/20* (2006.01)
  *H05K 1/03* (2006.01)
  *B60J 1/00* (2006.01)

(52) U.S. Cl.
  CPC .................. *B32B 17/10376* (2013.01); *B32B 17/10761* (2013.01); *B32B 17/10779* (2013.01); *H05K 1/0212* (2013.01); *H05K 1/0296* (2013.01); *H05K 1/0326* (2013.01); *B32B 2457/08* (2013.01); *B60J 1/001* (2013.01); *B60J 1/002* (2013.01)

(56) References Cited

U.S. PATENT DOCUMENTS

| | | |
|---|---|---|
| 2007/0278200 A1 | 12/2007 | Muromachi et al. |
| 2012/0228006 A1* | 9/2012 | Chen .................... H05K 1/0219 174/251 |
| 2016/0288459 A1 | 10/2016 | Keller et al. |
| 2016/0311402 A1 | 10/2016 | Suetsugu et al. |
| 2017/0223779 A1 | 8/2017 | Suetsugu et al. |

FOREIGN PATENT DOCUMENTS

| | | |
|---|---|---|
| EP | 1527107 B1 | 6/2007 |
| JP | H11-208421 A | 8/1999 |
| JP | 2003-513840 A | 4/2003 |
| JP | 2005-145211 A | 6/2005 |
| JP | 2012-014945 A | 1/2012 |
| JP | 2016-539905 A | 12/2016 |
| WO | WO 2001/030568 A1 | 5/2001 |
| WO | WO 2003/020776 A1 | 3/2003 |
| WO | WO 2004/005358 A1 | 1/2004 |
| WO | WO 2004/063231 A1 | 7/2004 |
| WO | WO 2004/063232 A1 | 7/2004 |
| WO | 2007039747 A1 | 4/2007 |
| WO | 2007083160 A1 | 7/2007 |
| WO | WO 2016/080406 A1 | 5/2016 |

OTHER PUBLICATIONS

Extended European Search Report dated Aug. 10, 2021 in European Application No. 18894547.1.

International Patent Application No. PCT/JP2018/048332; Int'l Written Opinion and Search Report; dated Mar. 5, 2019; 7 pages.

* cited by examiner

CIRCUIT-INCLUDING FILM

CROSS-REFERENCE TO RELATED APPLICATIONS

This application is the National Stage of International Patent Application No. PCT/JP2018/048332, filed Dec. 27, 2018, which claims priority to Japanese Patent Application No. 2017-254067, filed on Dec. 28, 2017, the disclosures of which are incorporated herein by reference in their entirety.

TECHNICAL FIELD

The present invention relates to: a circuit-including film which can be used in a laminated glass; and a laminated glass comprising the circuit-including film.

BACKGROUND ART

In automotive front glasses and the like, it has been demanded to remove fogging or freezing in the whole area of a window glass. As the method for removing the fogging or freezing, a method is known in which the fogging or freezing can be removed with heat by forming a conductive circuit between a laminated glass and then an allowing electric current to pass through the conductive circuit. On the other hand, in addition to the conductive circuit for removing the fogging or freezing, a conductive circuit for heating an area around a camera or a sensor intensively or a conductive circuit having a function of an antenna is also often needed. In this case, the heating of a window glass by allowing an electric current to pass through all of the conductive circuits is inefficient. For example, an electric power load can be reduced to further extent if the heating of the whole area of a window glass is halted and only an area around a camera or a sensor is heated after the removal of the fogging or freezing of the whole area of the window glass. Patent Document 1 discloses an electrically heated window glass comprising: two glass plates; a plurality of heaters (e.g., wire heaters, surface heaters) which can heat the glass plates and are arranged between the glass plates so as to divide each of the surfaces of the glass plates into a plurality of areas; and a plurality of bus bars which are respectively arranged at edge parts of the heaters and can allow an electric current to pass through the heaters. In the electrically heated window glass, the heaters may be used separately for the heating or a combination of them.

PRIOR ART DOCUMENT

Patent Document

Patent Document 1: JP-A-2005-145211

SUMMARY OF THE INVENTION

Problems to be Solved by the Invention

According to the studies made by the present inventors, however, front visibility may be deteriorated significantly when a wire heater or a surface heater is used as disclosed in Patent Document 1. In order to improve front visibility, a conductive fine wire circuit having a narrow line width can be used. However, it has been found that the conductive fine wire circuit may undergo disconnection during the production of a laminated glass.

Accordingly, the object of the present invention is to provide a circuit-including film which does not undergo disconnection (also referred to as "wire breakage", hereinafter) during the production of a laminated glass and can exhibit excellent front visibility after the production of a laminated glass using the circuit-including film, and in which an electric current can be allowed to pass through a plurality of conductive circuits separately. Another object of the present invention is to provide a laminated glass which does not undergo disconnection and has excellent front visibility and in which an electric current can be allowed to pass through a plurality of conductive circuits separately.

Means for Solving Problems

The present inventors have made extensive and intensive studies. As a result, it is found that the above-mentioned problems can be solved by a circuit-including film comprising a resin film (1) and a specific conductive fine wire circuit (A) and a specific conductive circuit (B) which are arranged on one surface of the resin film (1), wherein the resin film (1) contains at least one resin selected from the group consisting of a polyvinyl acetal resin, an ionomer resin and an ethylene-(vinyl acetate) copolymer resin. This finding leads to the accomplishment of the present invention. The present invention includes the following items.

[1] A circuit-including film comprising:
  a resin film (1); and
  a conductive fine wire circuit (A) and a conductive circuit (B) independent of the conductive fine wire circuit (A), which are arranged on one surface of the resin film (1),
  wherein the resin film (1) contains at least one resin selected from the group consisting of a polyvinyl acetal resin, an ionomer resin and an ethylene-(vinyl acetate) copolymer resin.

[2] The circuit-including film according to [1], wherein the conductive fine wire circuit (A) and/or the conductive circuit (B) are/is a circuit derived from a metal foil.

[3] The circuit-including film according to [1] or [2], wherein the conductive fine wire circuit (A) has a thickness of 1 to 30 μm.

[4] The circuit-including film according to any one of [1] to [3], wherein the conductive circuit (B) has a heating function.

[5] The circuit-including film according to any one of [1] to [3], wherein the conductive circuit (B) has a function of an antenna or a sensor.

[6] The circuit-including film according to any one of [1] to [5], wherein the resin film (1) contains a polyvinyl acetal resin in an amount of 50% by mass or more relative to the mass of the resin film (1).

[7] The circuit-including film according to [6], wherein the resin film (1) contains a plasticizer in an amount of 0 to 20% by mass relative to the mass of the resin film (1).

[8] The circuit-including film according to [6] or [7], wherein, when 10 parts by mass of the resin film (1) is dissolved in 90 parts by mass of a 1/1 (by mass) toluene/ethanol mixed solution to prepare a solution, the solution has a viscosity of 100 mPa·s or more as measured with a Brookfield-type (B-type) viscometer at 20° C., 30 rpm.

[9] The circuit-including film according to any one of [1] to [8], wherein the resin film (1) has a thickness of 10 to 350 μm.

[10] The circuit-including film according to any one of [1] to [9], wherein the conductive fine wire circuit (A) is made from copper or silver.

[11] The circuit-including film according to any one of [1] to [10], wherein the conductive fine wire circuit (A) is wholly or partly formed in a linear, grid-like, net-like or ghostleg-lottery-like shape.

[12] The circuit-including film according to any one of [1] to [11], wherein the conductive fine wire circuit (A) has a line width of 1 to 30 μm.

[13] The circuit-including film according to any one of [1] to [12], wherein the circuit-including film further comprises a resin film (2).

[14] The circuit-including film according to [13], wherein the resin film (2) contains a polyvinyl acetal resin in an amount of 50% by mass or more and a plasticizer in an amount of 10 to 50% by mass relative to the mass of the resin film (2).

[15] The circuit-including film according to [13] or [14], wherein the resin film (1), the conductive fine wire circuit (A) and the conductive circuit (B), and the resin film (2) are arranged in this order.

[16] The circuit-including film according to [13] or [14], wherein the resin film (2), the resin film (1), and the conductive fine wire circuit (A) and the conductive circuit (B) are arranged in this order.

[17] A laminated glass comprising:
at least two glasses; and
the circuit-including film according to any one of [13] to [16] between the at least two glasses,
wherein an average amount of the plasticizer in the resin film (1) and the resin film (2) is 5 to 50% by mass.

Effects of the Invention

The circuit-including film according to the present invention does not undergo disconnection (or wire breakage) during the production of a laminated glass, and has excellent front visibility. The laminated glass according to the present invention does not undergo disconnection (or wire breakage) and has excellent front visibility.

EMBODIMENTS OF THE INVENTION

Figure 1A:
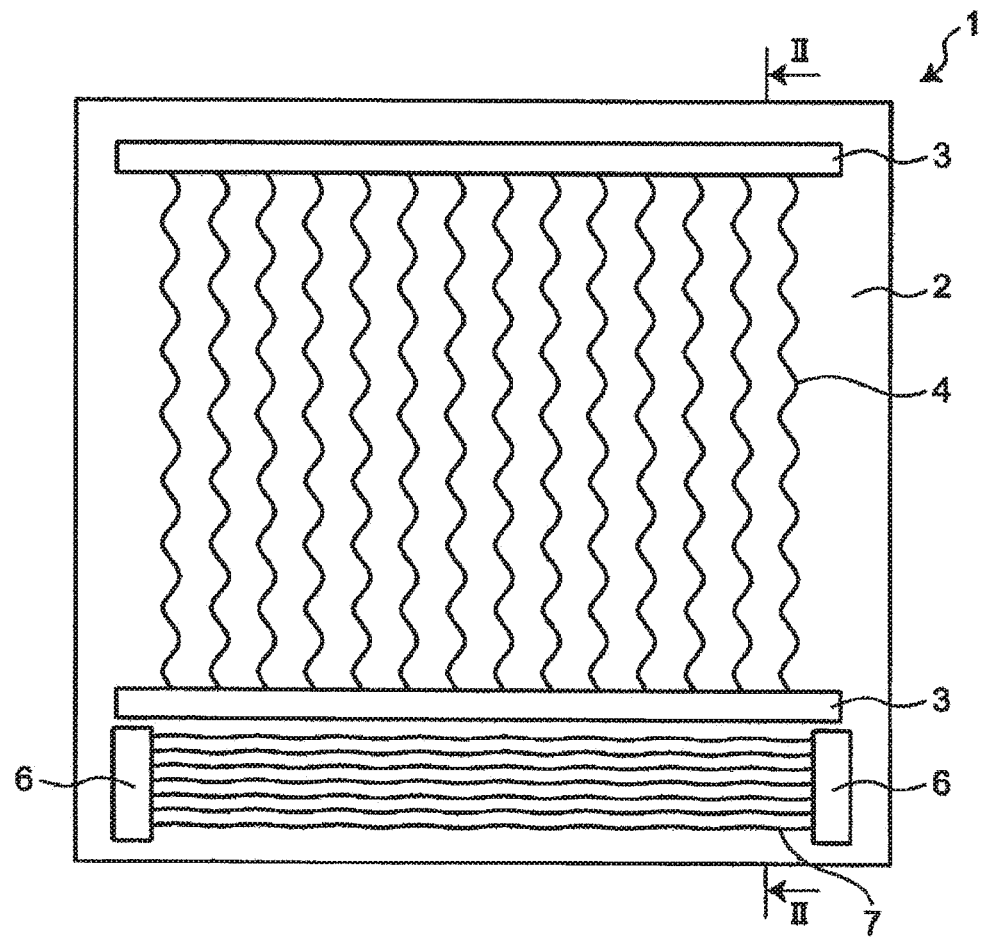
FIG. 1A is a schematic illustration showing one embodiment of the circuit-including film of the present invention.

[Circuit-Including Film]
The circuit-including film according to the present invention comprises
a resin film (1); and
a conductive fine wire circuit (A) and a conductive circuit (B) independent of the conductive fine wire circuit (A), which are arranged on one surface of the resin film (1). In the description, the conductive fine wire circuit (A) and the conductive circuit (B) are also collectively referred to as a "circuit".

<Resin Film (1)>
From the viewpoint of preventing the occurrence of detachment or deformation of the circuit during the production of a laminated glass, the resin film (1) contains at least one resin selected from the group consisting of a polyvinyl acetal resin, an ionomer resin and an ethylene-(vinyl acetate) copolymer resin [wherein the at least one resin also referred to as a "resin (1)", hereinafter]. According to this constitution, it becomes possible to prevent the occurrence of detachment or deformation of the circuit more readily during the production of a laminated glass using the circuit-including film of the present invention.

Examples of the polyvinyl acetal resin include a polyvinyl acetal resin produced by the acetalization of a vinyl alcohol resin such as polyvinyl alcohol or a vinyl alcohol copolymer. In the case where the resin film (1) contains a polyvinyl acetal resin, a single polyvinyl acetal resin may be contained, or two or more polyvinyl acetal resins that are different from each other with respect to at least one item selected from the viscosity average polymerization degree, the acetalization degree, the acetyl group amount, the hydroxyl group amount, the ethylene content, the molecular weight of an aldehyde to be used for the acetalization and the chain length may be contained. In the case where the polyvinyl acetal resin comprises different two or more polyvinyl acetal resins, from the viewpoint of the easiness of melt molding, the viewpoint of preventing the disconnection or deformation during the production of a laminated glass or the viewpoint of preventing the displacement of the like of glasses during the use of the laminated glass, the polyvinyl acetal resin preferably comprises a mixture of two or more polyvinyl acetal resins that are different from each other with respect to at least one item selected from the viscosity average polymerization degree, the acetalization degree, the acetyl group amount and the hydroxyl group amount.

The polyvinyl acetal resin to be used in the present invention can be produced by, but is not limited to, the following method. Firstly, an aqueous solution of a polyvinyl alcohol or a vinyl alcohol copolymer at a concentration of 3 to 30% by mass is retained in a temperature ranging from 80 to 100° C. and is then cooled gradually over 10 to 60 minutes. When the temperature is decreased to −10 to 30° C., an aldehyde (or a keto compound) and an acid catalyst are added to the solution, and then an acetalization reaction is carried out for 30 to 300 minutes while keeping the temperature constant. Subsequently, the reaction solution is heated to a temperature of 20 to 80° C. over 30 to 200 minutes, and then the reaction solution is retained at this temperature for 30 to 300 minutes. Subsequently, the reaction solution is optionally filtrated, is then neutralized by adding a neutralizing agent such as an alkali to the reaction solution, and then the resultant resin is filtrated out, is then washed with water, and is then dried. In this manner a polyvinyl acetal resin can be produced.

The acid catalyst to be used in the acetalization reaction is not particularly limited, and either one of an organic acid and an inorganic acid can be used. Examples of the acid catalyst include acetic acid, para-toluenesulfonic acid, nitric acid, sulfuric acid and hydrochloric acid. Among these acid catalysts, from the viewpoint of acidic strength and easiness of the removal during washing, hydrochloric acid, sulfuric acid and nitric acid are preferred.

The vinyl alcohol copolymer can be produced by the saponification of a copolymer of a vinyl ester and another monomer. Examples of the another monomer include: an α-olefin such as ethylene, propylene, n-butene and isobutylene; acrylic acid or a salt thereof, an acrylic acid ester such as methyl acrylate, ethyl acrylate, n-propyl acrylate, i-propyl acrylate, n-butyl acrylate, i-butyl acrylate, t-butyl acrylate, 2-ethylhexyl acrylate, dodecyl acrylate and octadecyl acrylate; methacrylic acid or a salt thereof, a methacrylic acid ester such as methyl methacrylate, ethyl methacrylate, n-propyl methacrylate, i-propyl methacrylate, n-butyl methacrylate, i-butyl methacrylate, t-butyl methacrylate, 2-ethylhexyl methacrylate, dodecyl methacrylate and octadecyl methacrylate; acrylamide; an acrylamide derivative such as N-methylacrylamide, N-ethylacrylamide, N,N-dimethylacrylamide, diacetoneacrylamide, acrylamide propanesulfonic acid or a salt thereof, acrylamide propyldimethylamine or a salt or quaternary salt thereof, and N-methylolacrylamide or a derivative thereof; methacrylamide; a methacrylamide derivative such as N-methylmethacrylamide, N-ethylmethacrylamide, methacrylamide propanesulfonic acid or a salt thereof, methacryamide propyldimethylamine or a salt or quaternary salt thereof, and N-methylolmethacrylamide or a derivative thereof; a vinyl ether such as methyl vinyl ether, ethyl vinyl ether, n-propyl vinyl ether, i-propyl vinyl ether, n-butyl vinyl ether, i-butyl vinyl ether, t-butyl vinyl ether, dodecyl vinyl ether and stearyl vinyl ether; a nitrile such as acrylonitrile and methacrylonitrile; a vinyl halide such as vinyl chloride and vinyl fluoride; a vinylidene halide such as vinylidene chloride and vinylidene fluoride; an allyl compound such as allyl acetate and ally chloride; an unsaturated dicarboxylic acid such as maleic acid, itaconic acid and fumaric acid, or a salt, ester or anhydride thereof; a vinylsilyl compound such as vinylmethoxysilane; and isopropenyl acetate. These another monomers may be used singly, or two or more of them may be used in combination. Among these monomers, ethylene is preferred as the another monomer.

From the viewpoint of obtaining a polyvinyl acetal resin having a preferred breaking energy more readily, the aldehyde (or keto compound) to be used in the production of the polyvinyl acetal resin preferably has a linear, branched or cyclic form, more preferably a linear or branched form, having 1 to 10 carbon atoms. As a result, a corresponding linear or branched acetal group can be obtained. The polyvinyl acetal resin to be used in the present invention may also be produced by the acetalization of a polyvinyl alcohol or a vinyl alcohol copolymer with a mixture of a plurality of aldehydes (or keto compounds). Only either one of the polyvinyl alcohol and the vinyl alcohol copolymer may be used, or a mixture of the polyvinyl alcohol and the vinyl alcohol copolymer may be used.

The polyvinyl acetal resin to be used in the present invention is preferably produced by the reaction between at least one polyvinyl alcohol and at least one aldehyde having 1 to 10 carbon atoms. If the number of carbon atoms in the aldehyde is more than 11, the acetalization reactivity may be deteriorated, and the blocking of the polyvinyl acetal resin may occur during the reaction, resulting in the difficulty of the synthesis of the polyvinyl acetal resin.

Examples of the aldehyde include aliphatic, aromatic and alicyclic aldehydes, such as formaldehyde, acetaldehyde, propionaldehyde, n-butyraldehyde, isobutyraldehyde, valeraldehyde, isovaleraldehyde, n-hexylaldehyde, 2-ethylbutyraldehyde, n-heptylaldehyde, n-octylaldehyde, 2-ethyhexanal, n-nonylaldehyde, n-decylaldehyde, benzaldehyde and cinnamaldehyde. Among these compounds, an aliphatic non-branched aldehyde having 2 to 6 carbon atoms is preferred, and n-butyraldehyde is particularly preferred from the viewpoint that a polyvinyl acetal resin having a preferred breaking energy can be produced more readily. These aldehydes may be used singly, or two or more of them may be used in combination. Furthermore, a polyfunctional aldehyde or an aldehyde having another functional group may also be used in combination in an amount of 20% by mass or less relative to the total mass of the aldehydes. In the case where n-butyraldehyde is used, the content of n-butyraldehyde in all of the aldehydes to be used in the acetalization is preferably 50% by mass or more, more preferably 80% by mass or more, still more preferably 95% by mass or more, particularly preferably 99% by mass or more, and may be 100% by mass.

The viscosity average polymerization degree of the polyvinyl alcohol that serves as a raw material for the polyvinyl acetal resin is preferably 100 or more, more preferably 300 or more, more preferably 400 or more, still more preferably 600 or more, particularly preferably 700 or more, most preferably 750 or more. When the viscosity average polymerization degree of the polyvinyl alcohol is equal to or more than the above-mentioned lower limit value, the disconnection or deformation during the production of a laminated glass can be prevented more readily and the occurrence of the phenomenon that glasses are misaligned due to heat in the resultant laminated glass can be prevented more readily. The viscosity average polymerization degree of the polyvinyl alcohol is preferably 5000 or less, more preferably 3000 or less, still more preferably 2500 or less, particularly preferably 2300 or less, most preferably 2000 or less. When the viscosity average polymerization degree of the polyvinyl alcohol is equal to or less than the above-mentioned upper limit value, satisfactory film formability can be achieved more readily. The viscosity average polymerization degree of the polyvinyl alcohol can be measured in accordance with, for example, JIS K 6726 "Polyvinyl alcohol Test Method".

In general, the viscosity average polymerization degree of the polyvinyl acetal resin coincides with the viscosity average polymerization degree of the polyvinyl alcohol that is a raw material for the polyvinyl acetal resin. Therefore, the above-mentioned preferred viscosity average polymerization degree of the polyvinyl alcohol coincides with the preferred viscosity average polymerization degree of the polyvinyl acetal resin. In the case where the resin film (1) contains different two or more polyvinyl acetal resins, it is preferred that the viscosity average polymerization degree of at least one of the polyvinyl acetal resins is equal to or more than the above-mentioned lower limit value and equal to or less than the above-mentioned upper limit value.

The acetyl group amount in the polyvinyl acetal resin that constitutes the resin film (1) is preferably 0.01 to 20% by mass, more preferably 0.05 to 10% by mass, still more preferably 0.1 to 5% by mass, based on the ethylene units in the polyvinyl acetal main chain. The acetyl group amount in the polyvinyl acetal resin can be adjusted by appropriately adjusting the degree of saponification of the polyvinyl alcohol or the vinyl alcohol copolymer which is a raw material for the polyvinyl acetal resin. The acetyl group amount has influence on the polarity of the polyvinyl acetal resin in such a manner that the compatibility of a plasticizer with the resin film (1) and the mechanical strength of the resin film (1) can vary. In the case where the resin film (1) contains a polyvinyl acetal resin having an acetyl group amount falling within the above-mentioned range, the decrease in optical strain or the like can be achieved more readily. In the case where the resin film (1) contains different two or more polyvinyl acetal resins, it is preferred that the acetyl group amount of at least one of the polyvinyl acetal resins falls within the above-mentioned range.

The acetalization degree of the polyvinyl acetal resin to be used in the present invention is not particularly limited, and is preferably 40 to 86% by mass, more preferably 45 to 84% by mass, still more preferably 50 to 82% by mass, particularly preferably 60 to 82% by mass, most preferably 68 to 82% by mass. The acetalization degree of the polyvinyl acetal resin can be adjusted to a value falling within the above-mentioned range by appropriately adjusting the amount of the aldehyde to be used in the acetalization of the polyvinyl alcohol resin. When the acetalization degree falls within the above-mentioned range, the mechanical strength of the laminated glass of the present invention can become sufficient more readily, and the compatibility between the polyvinyl acetal resin and the plasticizer can be hardly deteriorated. In the case where the resin film (1) contains two or more different polyvinyl acetal resins, it is preferred that the acetalization degree of at least one of the polyvinyl acetal resins falls within the above-mentioned range.

The hydroxyl group amount of the polyvinyl acetal resin is preferably 6 to 26% by mass, more preferably 12 to 24% by mass, more preferably 15 to 22% by mass, particularly preferably 18 to 21% by mass, based on the ethylene units in the polyvinyl acetal main chain. For the further impartment of sound insulation performance, the range of the hydroxyl group amount is preferably 6 to 20% by mass, more preferably 8 to 18% by mass still more preferably 10 to 15% by mass, particularly preferably 11 to 13% by mass. The hydroxyl group amount can be adjusted to a value falling within the above-mentioned range by adjusting the amount of the aldehyde to be used in the acetalization of the polyvinyl alcohol resin. When the hydroxyl group amount falls within the above-mentioned range, the difference in refractive index between the resin film (1) and the below-mentioned resin film (2) is reduced and, as a result, a laminated glass having less optical unevenness can be obtained more surely. In the case where the resin film (1) contains different two or more polyvinyl acetal resins, it is preferred that the hydroxyl group amount of at least one of the polyvinyl acetal resins falls within the above-mentioned range.

The polyvinyl acetal resin is generally composed of an acetal group unit, a hydroxyl group unit and an acetyl group unit. The amount of each of the units can be determined by, for example, JIS K 6728 "Polyvinyl butyral test method" or a nuclear magnetic resonance method (NMR). In the case where the polyvinyl acetal resin contains a unit other than an acetal group unit, the amount of the remaining acetal group unit can be calculated by determining both of the amount of a hydroxyl group unit and the amount of an acetyl group unit, and then subtracting the amounts of both of these units from the amount of an acetal group unit obtained in the case where no unit other than an acetal group unit is contained.

From the viewpoint of achieving satisfactory film formability more surely, it is preferred that the resin film (1) contains an uncrosslinked polyvinyl acetal. However, the resin film (1) may also contain a crosslinked polyvinyl acetal. The method for crosslinking a polyvinyl acetal is disclosed in, for example, EP 1527107B1 and WO 2004/063231 A1 ("Thermal self-crosslinking of polyvinyl acetal containing carboxyl group"), EP 1606325 A1 ("Polyvinyl acetal crosslinked with polyaldehyde"), and WO 2003/020776 A1 ("Polyvinyl acetal crosslinked with glyoxylic acid"). A method is also effective, in which the conditions for the acetalization reaction are appropriately modified to adjust the amount of formed intermolecular acetal bonds or adjust the degree of blocking of remaining hydroxyl groups.

The ionomer resin is not particularly limited, and examples of the ionomer resin include a thermoplastic resin having a constituent unit derived from an olefin such as ethylene or a constituent unit derived from an α,ß-unsaturated carboxylic acid, wherein at least a part of the α,=-unsaturated carboxylic acid is neutralized with a metal ion. Examples of the metal ion include: an alkali metal ion such as a sodium ion; an alkaline earth metal ion such as a magnesium ion; and a zinc ion. In an ethylene-α,ß-unsaturated carboxylic acid copolymer that is not neutralized with the metal ion yet, the content of the α,ß-unsaturated carboxylic acid-derived constituent unit is preferably 2% by mass or more, more preferably 5% by mass or more, relative to the mass of the ethylene-α,ß-unsaturated carboxylic acid copolymer. The content of the α,ß-unsaturated carboxylic acid-derived constituent unit is also preferably 30% by mass or less, more preferably 20% by mass or less. Examples of the α,ß-unsaturated carboxylic acid-derived constituent unit in the ionomer resin include constituent units respectively derived from acrylic acid, methacrylic acid, maleic acid, monomethyl maleate, monoethyl maleate and anhydrous maleic acid. Among these constituent units, a constituent unit derived from acrylic acid or methacrylic acid is particularly preferred. From the viewpoint of the easy availability, the ionomer resin is more preferably an ionomer of an ethylene-(acrylic acid) copolymer and an ionomer of an ethylene-(methacrylic acid) copolymer are more preferred, and a zinc ionomer of an ethylene-(acrylic acid) copolymer, a sodium ionomer of an ethylene-(acrylic acid) copolymer, a zinc ionomer of an ethylene-(methacrylic acid) copolymer and a sodium ionomer of an ethylene-(methacrylic acid) copolymer are particularly preferred. These ionomer resins may be used singly, or two or more of them may be used in combination.

In the ethylene-(vinyl acetate) copolymer resin, the ratio of the amount of a vinyl acetate unit to the total amount of an ethylene unit and the vinyl acetate unit is preferably less than 50% by mole, more preferably less than 30% by mole, still more preferably less than 20% by mole, particularly preferably less than 15% by mole. When the ratio of the amount of the vinyl acetate unit to the total amount of the ethylene unit and the vinyl acetate unit is less than 50% by mole, mechanical strength and flexibility required for the resin film (1) included in the circuit-including film to be used in the laminated glass tend to be exerted satisfactorily.

In the circuit-including film according to the present invention, since the resin film (1) contains at least one resin selected from the group consisting of the polyvinyl acetal resin, the ionomer resin and the ethylene-(vinyl acetate) copolymer resin, the disconnection or deformation of the conductive fine wire circuit (A) and the conductive circuit (B) during the production of a laminated glass can be suppressed or prevented effectively.

It is preferred that the resin film (1) contains the polyvinyl acetal resin in an amount of preferably 50% by mass or more, more preferably 70% by mass or more, still more preferably 90% by mass or more, particularly preferably 100% by mass, relative to the mass of the resin film (1). When the content of the polyvinyl acetal resin in the resin film (1) falls within the above-mentioned range, the disconnection, deformation or the like during the production of a laminated glass can be suppressed or prevented more effectively and the front visibility of the resultant laminated glass can also be improved. The term "front visibility" as used herein refers to the viewability of a space on the rear side of a surface of a laminated glass through the laminated glass when the surface of the laminated glass is observed with naked eyes, and the wordings "the front visibility is improved" means that the space on the rear side of the surface of the glass becomes more viewable.

When 10 parts by mass of the resin film (1) is dissolved in 90 parts by mass of a 1/1 (by mass) toluene/ethanol mixed solution to prepare a solution, the viscosity of the solution is preferably 100 mPa·s or more, more preferably 150 mPa·s or more, still more preferably 200 mPa·s or more, particularly preferably 240 mPa·s or more, as measured with a Brookfield-type (B-type) viscometer at 20° C., 30 rpm. When the viscosity of the resin film (1) is equal to or more than the above-mentioned lower limit value, the disconnection, deformation or the like during the production of a laminated glass can be prevented more readily and the phenomenon that glasses are misaligned due to heat in the resultant laminated glass can be prevented more readily. In the case where the resin film (1) is composed of a mixture of a plurality of resins, it is preferred that the viscosity of the mixture is equal to or more than the above-mentioned lower limit value. The upper limit value of the viscosity is generally 1000 mPa·s, preferably 800 mPa·s, more preferably 500 mPa·s, still more preferably 450 mPa·s, particularly preferably 400 mPa·s, from the viewpoint that satisfactory film formability can be achieved more readily. In the case where the resin film (1) is composed of a polyvinyl acetal resin, the viscosity of the polyvinyl acetal resin or polyvinyl acetal resins can be adjusted to a value equal to or more than the above-mentioned lower limit value by using a polyvinyl acetal resin produced using a polyvinyl alcohol having a high viscosity average polymerization degree as a raw material or a portion of a raw material, or also by using the polyvinyl acetal resin in combination.

The resin film (1) may contain a plasticizer. The content of the plasticizer to be contained in the resin film (1) is preferably 0 to 20% by mass, more preferably 0 to 15% by mass, relative to the mass of the resin film (1). When the content of the plasticizer falls within the above-mentioned range, a circuit-including film having excellent film formability and handling properties can be produced more readily and the disconnection, deformation or the like of the circuit during the production of a laminated glass can be suppressed more readily. From the viewpoint of circuit printing properties and film storage stability, it is preferred that the resin film (1) contains no plasticizer.

In the case where the resin film (1) contains a plasticizer, it is preferred to use one or more compounds selected from the compounds included in the following group.

An ester of a polyvalent aliphatic or aromatic acid. Examples of the ester include a dialkyl adipate (e.g., dihexyl adipate, di-2-ethylbutyl adipate, dioctyl adipate, di-2-ethylhexyl adipate, hexylcylcohexyl adipate, a mixture of heptyl adipate and nonyl adipate, diisononyl adipate, heptyl adipate); an ester of adipic acid and an alcohol comprising an alicyclic ester alcohol or ether compound (e.g., di(butoxyethyl) adipate, di(butoxyethoxyethyl) adipate); a dialkyl sebacate (e.g., dibutyl sebacate); an ester of sebacic acid and an alcohol comprising an alicyclic or ether compound; an ester of phthalic acid (e.g., butylbenzyl phthalate, bis-2-butoxyethyl phthalate); and an ester of an alicyclic polycarboxylic acid and an aliphatic alcohol (e.g., 1,2-cyclohexanedicaroboxylic acid diisononyl ester).

An ester or ether of a polyhydric aliphatic or aromatic alcohol or an oligoether glycol having one or more aliphatic or aromatic substituent. Examples of the compound include an ester of glycerin, diglycol, triglycol, tetraglycol or the like and a linear or branched aliphatic or alicyclic carboxylic acid. Concrete examples of the compound include diethylene glycol-bis-(2-ethylhexanoate), triethylene glycol-bis-(2-ethylhexanoate), triethylene glycol-bis-(2-ethylbutanoate), tetraethylene glycol-bis-n-heptanoate, triethylene glycol-bis-n-heptanoate, triethylene glycol-bis-n-hexanoate, tetraethylene glycol dimethyl ether and dipropylene glycol benzoate.

A phosphoric acid ester of an aliphatic or aromatic ester alcohol. Examples of the phosphoric acid ester include tris(2-ethylhexyl) phosphate (TOF), triethyl phosphate, diphenyl-2-ethylhexyl phosphate and tricresyl phosphate.

An ester of citric acid, succinic acid and/or fumaric acid.

In addition, a polyester or oligoester formed from a polyhydric alcohol and a polycarboxylic acid, or a terminal-esterified or etherified product of the polyester or oligoester; a polyester or oligoester formed from a lactone or a hydroxycarboxylic acid, or a terminal-esterified or etherified product of the polyester or oligoester; and others may also be used as the plasticizer.

In the case where each of the resin film (1) and the below-mentioned resin film (2) contains a plasticizer, from the viewpoint of eliminating the problem associated with the migration of the plasticizer between both of the resin films (e.g., the problem of the change in properties over time), it is preferred to use a plasticizer that is the same as that contained in the resin film (2) or a plasticizer that cannot deteriorate a property (e.g., heat resistance, light resistance, transparency, plasticization efficiency) of the resin film (2). From these viewpoints, it is preferred to contain, as the plasticizer, triethylene glycol-bis-(2-ethylhexanoate), triethylene glycol-bis(2-ethylbutanoate), tetraethylene glycol-bis-(2-ethylhexanoate) or tetraethylene glycol-bisheptanoate, and it is particularly preferred to contain triethylene glycol-bis-(2-ethylhexanoate).

The resin film (1) may contain an additive. Examples of the additive include water, an ultraviolet ray absorber, an antioxidant agent, an adhesion modifier, a whitening agent or a fluorescent whitening agent, a stabilizing agent, a dye, a processing auxiliary agent, organic or inorganic nanoparticles, calcined silicate, and a surface activating agent. These additives may be used singly, or two or more of them may be used in combination.

In one aspect, for the purpose of suppressing the corrosion of the conductive fine wire circuit (A) or the conductive circuit (B), it is preferred that the resin film (1) contains a corrosion inhibitor. The content of the corrosion inhibitor to be contained in the resin film (1) is preferably 0.005 to 5% by mass relative to the mass of the resin film (1). An example of the corrosion inhibitor is substituted or unsubstituted benzotriazole.

The thickness of the resin film (1) is preferably 10 to 350 μm, more preferably 30 to 300 μm, still more preferably 50 to 300 μm. When the thickness of the resin film falls within the above-mentioned range, the thermal shrinkage of the resin film (1) can be prevented effectively, and the disconnection, deformation or the like of the circuit can also be prevented or suppressed effectively.

The method for producing the resin film (1) is not particularly limited. It is possible that the resin (1), which is optionally blended with specified amounts of the plasticizer and the additives, is kneaded homogeneously, and then the resultant product is formed into a film (layer) by a publicly known film formation method such as an extrusion method, a calendar method, a press method, a casting method and an inflation method, and the film (layer) is used as the resin film (1).

Among the publicly known film formation methods, a method in which the film is produced using an extruder is particularly preferably employed. The resin temperature to be employed in the extrusion is preferably 150 to 250° C., more preferably 170 to 230° C. If the resin temperature is too high, the polyvinyl acetal resin may be decomposed and, as a result, the content of a volatile substance may increase. On the other hand, if the temperature is too low, the content of a volatile substance may also increase. In order to remove the volatile substance effectively, it is preferred to remove the volatile substance through a vent port of the extruder by the reduction of pressure. In the case where the resin film (1) is produced using an extruder, the resin film (1) may be melt-extruded onto a metal foil, as mentioned later.

<Conductive Fine Wire Circuit (A) and Conductive Circuit (B)>

The circuit-including film of the present invention has a conductive fine wire circuit (A) and a conductive circuit (B) independent of the conductive fine wire circuit (A) both on one surface of the resin film (1). The circuit-including film of the present invention may have two or more conductive fine wire circuits (A) and conductive circuits (B) depending on the intended use.

The conductive fine wire circuit (A) is preferably a circuit derived from a metal foil. In the case where the conductive fine wire circuit (A) is a circuit derived from a metal foil, it is preferred to produce the conductive fine wire circuit (A) by, for example, thermally press-bonding the resin film (1) and the metal foil to each other while overlaying the resin film (1) and the metal foil on each other, or by melt-extruding the resin film (1) on the metal foil and then forming a predetermined conductive structure employing a photolithographic technique. Alternatively, the conductive fine wire circuit (A) may also be produced by printing a UV-curable nano metal ink so as to form a predetermined conductive structure by a conventional printing method such as a typography method, and then irradiating the printed ink with UV light to cure the ink.

From the viewpoint of the easiness of etching and the easy availability of the metal foil, the conductive fine wire circuit (A) is preferably made from copper or silver. Namely, the metal foil is preferably a copper foil or a silver foil and the metal ink is preferably a silver ink or a copper ink.

From the viewpoint of achieving both of the front visibility and required heat-generating properties of a laminated glass, the conductive fine wire circuit (A) is preferably wholly or partly formed in a linear, grid-like, net-like or ghostleg-lottery-like shape.

Examples of the linear shape include a straight line-like shape, a wavy line-like shape, and a zig-zag shape. In the conductive fine wire circuit (A), the shapes at all parts may be the same as each other or a plurality of shapes may be included.

The term "ghostleg-lottery-like shape" as used herein refers to a shape in which a plurality of transverse fine wires (auxiliary conductive fine wires) to which a plurality of vertical fine wires (main conductive fine wires) are joined are arranged at equal or different intervals, like a lottery called "ladder lottery" in Japan.

In this case, each of the vertical fine wires (main conductive fine wires) and the transverse fine wires (auxiliary conductive fine wires) may have any one of a straight line-like shape, a wavy line-like shape, a zig-zag shape and the like.

The line width of the conductive fine wire circuit (A) is preferably 1 to 30 µm, more preferably 2 to 20 µm, still more preferably 2 to 15 µm, particularly preferably 3 to 12 µm. When the line width of the conductive fine wire circuit (A) falls within the above-mentioned range, the front visibility after the production of a laminated glass can be achieved more readily, and sufficient heating properties can also be achieved more readily. In the case where the conductive fine wire circuit (A) has a bus bar as mentioned later, the line width of the bus bar is not limited to a value falling within the above-mentioned preferred range and may have any value.

From the viewpoint of reducing the reflection of light and achieving a required heat generation amount more readily, the thickness of the conductive fine wire circuit (A) is preferably 1 to 30 µm, more preferably 2 to 20 µm, still more preferably 3 to 15 µm, particularly preferably 3 to 12 µm. The thickness of the conductive fine wire circuit (A) can be measured using a thickness meter, a laser microscope or the like. In the case where the conductive fine wire circuit (A) has a bus bar as mentioned later, the thickness of the bus bar is not limited to a value falling within the above-mentioned preferred range, and may have any value.

It is preferred that one surface or both surfaces of the conductive fine wire circuit (A) is/are low-reflectance-treated. The wording "a surface is low-reflectance-treated" as used herein refers to the matter that the surface is treated so as to have a visible light reflectance of 30% or less as measured in accordance with JIS R 3106. From the viewpoint of achieving more satisfactory front visibility, it is preferred that the surface is treated so as to have a visible light reflectance of 10% or less. When the visible light reflectance is equal to or less than the above-mentioned upper limit value, a desired visible light reflectance can be achieved more surely when a laminated glass provided with a circuit-including film having the resin film (1) and the below-mentioned resin film (2) is produced.

Examples of the low-reflectance treatment include a brackish finish treatment (a darkish finish treatment), a brownish finish treatment, and a plating treatment. From the viewpoint of process passability, the low-reflectance treatment is preferably a blackish finish treatment. Therefore, from the viewpoint of satisfactory front visibility, it is particularly preferred that one surface of both surfaces of the conductive fine wire circuit (A) is/are blackish-finish-treated so that the visible light reflectance can become 10% or less. The blackish finish treatment is carried out using, for example, an alkaline blackish finish solution.

The conductive fine wire circuit (A) can include a bus bar. In the case where a bus bar is included, the conductive fine wire is connected to the bus bar. As the bus bar, a bus bar which is commonly used in the art can be used. Examples of the bus bar include a metal foil tape, a metal foil tape having a conductive adhesive agent attached thereto, and a conductive paste. Alternatively, the bus bar may be formed by leaving a part of the metal foil as the bus bar simultaneously with the formation of the conductive fine wire circuit (A). Power feed lines are connected to the bus bar. An electric current is fed to the conductive fine wire circuit (A) upon the connection of each of the power feed lines to a power supply.

The conductive circuit (B) is arranged on one surface of the resin film (1) independently of the conductive fine wire circuit (A). Therefore, different functions can be imparted to the conductive fine wire circuit (A) and the conductive circuit (B) from each other. Even in the case where the same function is imparted to both of the conductive fine wire circuit (A) and the conductive circuit (B), the circuits can be operated separately, and therefore it becomes possible to further reduce an electric power load. More specifically, when the conductive fine wire circuit (A) and the conductive circuit (B) have the same heating function as each other, the conductive fine wire circuit (A) is arranged on the whole area of a window glass and the conductive circuit (B) is arranged around a camera or sensor, an electric power load can be further reduced compared with circuits that are needed to be heated at once, because these circuits can be heated separately depending on situations.

By using the conductive circuit (B), a film having, attached thereto, a plurality of conductive circuit-including films having different functions from each other can be formed on a single plane. By using the conductive circuit-including film, a laminated glass in which an electric current can be allowed to pass through a plurality of conductive circuits arranged on a single plane and having different functions from each other can be formed.

The conductive circuit (B) may have various functions, and preferably has a heating function, an antenna function or a sensor function.

In the case where the conductive circuit (B) has a heating function, the thickness of the conductive circuit (B) is preferably 1 to 30 μm, more preferably 2 to 20 μm, still more preferably 3 to 15 μm, particularly preferably 3 to 12 μm, from the viewpoint of visibility. In the case where the conductive circuit (B) has an antenna function or a sensor function, the thickness of the conductive circuit (B) is generally 500 μm or less, preferably 5 to 250 μm, more preferably 10 to 150 μm, from the viewpoint of radio wave properties. The thickness of the conductive circuit (B) can be measured using a thickness meter, a laser microscope or the like.

The conductive circuit (B) can include a bus bar. For example, in the case where the conductive circuit (B) has fine wires as in the case of the conductive fine wire circuit (A), the fine wires may be connected to the bus bar. In the case where the conductive circuit (B) has an antenna function, the antenna may be connected to the bus bar. Examples of the bus bar are the same as the bus bars which are exemplified as the bus bar included in the conductive fine wire circuit (A). Power feed lines are connected to the bus bar. An electric current is fed to the conductive circuit (B) upon the connection of each of the power feed lines to a power supply.

In the case where the conductive circuit (B) has a heating function, the conductive circuit (B) may be the same circuit as the conductive fine wire circuit (A) that is a circuit derived from a metal foil, or may be a circuit having a different shape, line width, material or the like from that of the conductive fine wire circuit (A). Examples of the shape, line width, material and the like of the conductive circuit (B) include those shapes and materials which are exemplified for the conductive fine wire circuit (A) and those line width ranges which are exemplified for the conductive fine wire circuit (A). In the case where the conductive circuit (B) has a bus bar, the line width of the bus bar is not limited to a value falling within the above-mentioned preferred range and may have any value. Other embodiments of the constitution of the conductive circuit (B) may be the same as the preferred embodiments of the constitution of the conductive fine wire circuit (A).

Figure 1B:
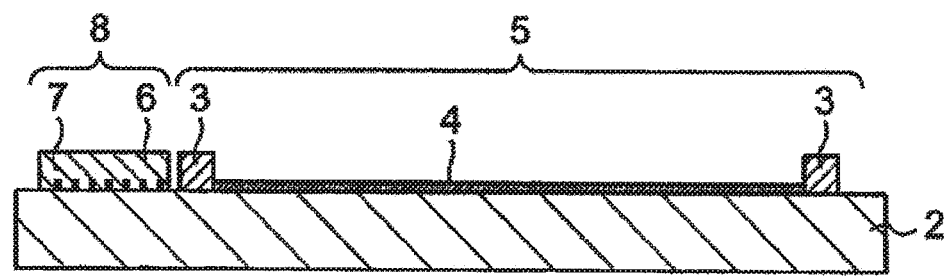
FIG. 1B is a cross-sectional view of the circuit-including film shown in FIG. 1A, which is taken along the line II-II of FIG. 1A.

An embodiment of the circuit-including film of the present invention in which each of the conductive fine wire circuit (A) and the conductive circuit (B) has a heating function is shown in FIG. 1A. FIG. 1B is a cross-sectional view of the circuit-including film shown in FIG. 1A, which is taken along the line II-II of FIG. 1A. A circuit-including film 1 shown in FIGS. 1A and 1B is provided with: a resin film 2; and a conductive fine wire circuit 5 that includes two bus bars 3 and a plurality of wavy line-like conductive fine wires 4 connecting the two bus bars 3 to each other; and a conductive circuit 8 that includes two bus bars 6 and a plurality of wavy line-like conductive fine wires 7 connecting the two bus bars 6 to each other, both of which are included on one surface of the resin film 2. The conductive fine wire circuit 5 and the conductive circuit 8 are independent of each other, and therefore an electric current can be fed to the bus bars 3 included in the conductive fine wire circuit 5 and the bus bars 6 included in the conductive circuit 8 separately. For example, in the case where a laminated glass provided with the circuit-including film 1 is used as a front glass of a vehicle, the whole area of the front glass can be heated with the conductive fine wire circuit 5 and a wiper part can be heated with the conductive circuit 8. Namely, since the conductive fine wire circuit (A) and the conductive circuit (B) can be heated separately depending on situations, an electric power load can be reduced. In FIGS. 1A to 4B, for ease of visibility of the drawings, the dimensions or proportions of the constituent elements are differently illustrated appropriately.

Figure 2A:
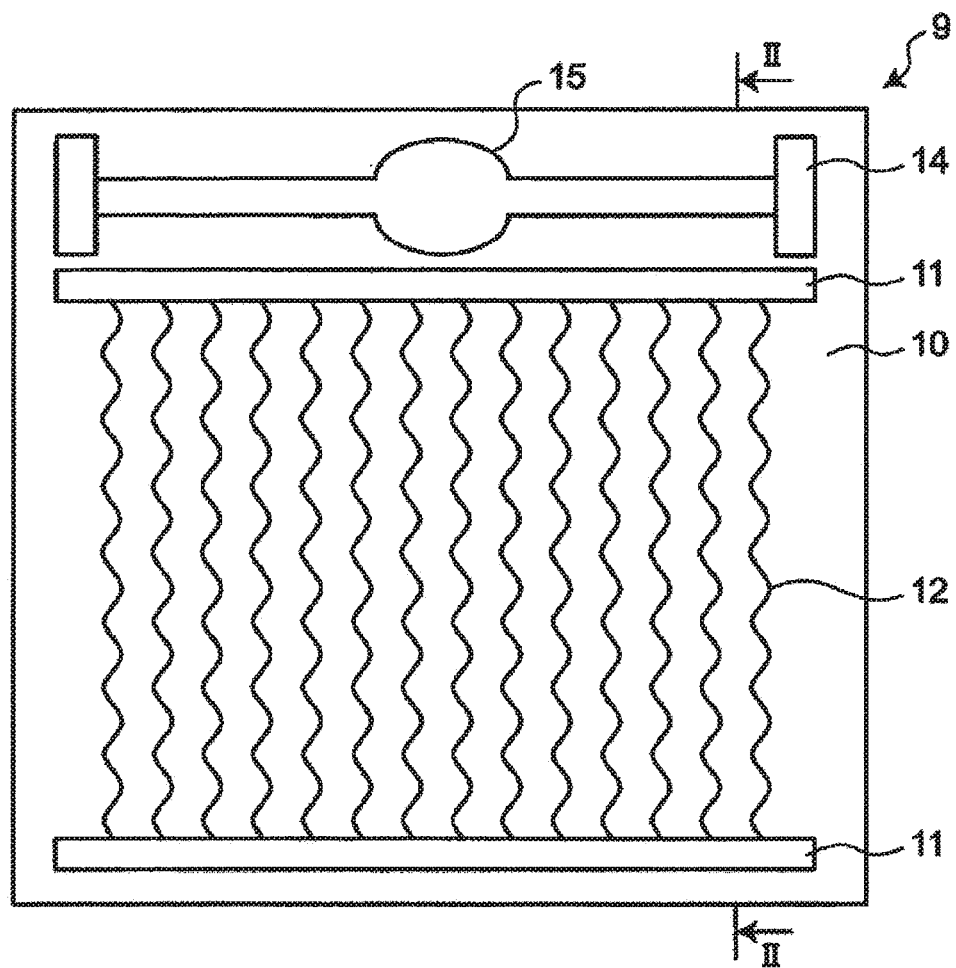
FIG. 2A is a schematic illustration showing one embodiment of the circuit-including film of the present invention.
Figure 2B:
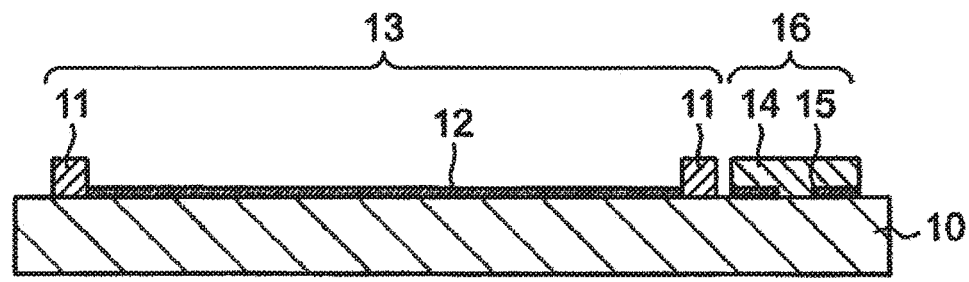
FIG. 2B is a cross-sectional view of the circuit-including film shown in FIG. 2A, which is taken along the line II-II of FIG. 2A.

Another embodiment of the circuit-including film of the present invention in which each of the conductive fine wire circuit (A) and the conductive circuit (B) has a heating function is shown in FIG. 2A. FIG. 2B is a cross-sectional view of the circuit-including film shown in FIG. 2A, which is taken along the line II-II of FIG. 2A. A circuit-including film 9 shown in FIGS. 2A and 2B is provided with: a resin film 10; and a conductive fine wire circuit 13 that has two bus bars 11 and a plurality of wavy line-like conductive fine wires 12 connecting the two bus bars 11 to each other and a conductive circuit 16 that has two bus bars 14 and two linear conductive fine wires 15 connecting the two bus bars 14 to each other, both of which are included on one surface of the resin film 10. Each of the conductive fine wires 15 has a linear structure composed of two straight line-like parts that extend from each of the bus bars 14 and curved parts that connect the two straight line-like parts to each other. The curved parts in the two conductive fine wires 15 are curved outwardly relative to each other. The conductive fine wire circuit 13 and the conductive circuit 16 are independent of each other, and therefore an electric current can be fed to the bus bars 11 included in the conductive fine wire circuit 13 and the bus bars 14 included in the conductive circuit 16 separately. For example, in the case where a laminated glass provided with the circuit-including film 9 is used as a front glass of a vehicle, the whole area of the front glass can be heated with the conductive fine wire circuit 13 and a rain sensor part can be heated with the conductive circuit 16. Namely, since the conductive fine wire circuit (A) and the conductive circuit (B) can be heated separately depending on situations, an electric power load can be reduced.

In the case where the conductive circuit (B) acts as an antenna, the form of the conductive circuit (B) is not particularly limited, as long as the form can have a receiving/sending function in a television, a radio, a mobile phone, an ETC, a wireless LAN or the like. In the case of a loop-like antenna, the length in the longer axis direction may be about ⅕ to ½ of the wavelength of a radio wave to be received/sent by/from the antenna. For example, in the case where an antenna for DTVs is to be installed at a window glass of a vehicle, the length of the antenna in the longer axis direction is preferably 10 to 300 mm, more preferably 30 to 250 mm, still more preferably 50 to 200 mm, and the length of the antenna in the shorter axis direction may the same as that in the longer axis direction and is preferably 10 to 250 mm, more preferably 20 to 200 mm, still more preferably 30 to 150 mm. In this regard, the length in the shorter axis direction, i.e., the width of a loop, may be short, as long as the loop can be formed.

In the case of a pole-like antenna, the length of the pole-like antenna (i.e., the length of a linear conductive body or the length in the longer axis direction) may be ¹⁄₁₀ or more of the wavelength of a radio wave to be received/sent by/from the antenna. For example, in the case of an antenna for DTVs, the length of the pole-like antennas is preferably 50 to 100 mm, more preferably 30 to 90 mm. The width (i.e., the length in the shorter axis direction) of the pole-like antenna is not particularly limited, and is preferably 10 to 50 mm, more preferably 20 to 40 mm.

The method for forming the conductive circuit (B) that acts as an antenna is not particularly limited. The conductive circuit (B) can be formed by forming a conductive body such as a silver paste or a copper foil, for example, by pressing a self-welding metal wire against a surface of a resin film (1) on which the conductive fine wire circuit (A) is formed using a number-controlled wiring machine while heating the resin film (1) having the conductive fine wire circuit (A) formed thereon. In this regard, the method for forming the conductive circuit (B) can be carried out while heating the self-welding metal wire.

The self-welding metal wire is preferably one in which a fusing resin such as a thermoplastic resin or a thermosetting resin is coated around a metal wire. For the purpose of imparting insulation properties to the antenna, an insulating resin may be applied beneath the fusing resin.

Examples of the metal wire include various types of metal wires such as a copper wire, a gold wire, a silver wire, an aluminum wire, a tungsten wire, a brass wire, and a wire made from an alloy of two or more of the aforementioned metals, and a copper wire is preferred. The cross-sectional shape of the metal wire is not particularly limited. Examples of the cross-sectional shape include an approximately elliptic shape, an approximately circular shape, an approximately polygonal shape [e.g., an approximately triangular shape, an approximately tetragonal shape (e.g., an approximately rectangular shape, an approximately square shape), an approximately hexagonal shape], and an approximately circular shape is preferred. In the case where the metal wire has an approximately circular shape, the longer axis diameter is generally required to be 500 μm or less, and is preferably 5 to 250 μm, more preferably 40 to 150 μm. If the longer axis diameter is less than a value falling within the range, the radio wave properties may be deteriorated. If the longer axis diameter is more than a value falling within the range, the front visibility may be deteriorated.

Examples of the fusing resin include various resins such as a polyvinyl butyral resin, a polyvinyl alcohol resin, a polyvinyl formal resin, a vinyl acetate resin, an acrylic resin, a urethane resin, a polyester resin, an epoxy resin, a phenoxy resin, a polyesterimide resin, a polyamide resin, a polyamidimide resin and a polyimide resin. Among these resins, a polyvinyl butyral resin is preferred from the viewpoint of visibility. As the polyvinyl butyral resin, a commercially available polyvinyl butyral resin that can be used as a fusing resin for a self-welding metal wire can be used.

The thickness of the fusing resin that coats the metal wire is generally 0.1 to 100 μm, more preferably 1 to 50 μm, still more preferably 1 to 10 μm.

Figure 3A:
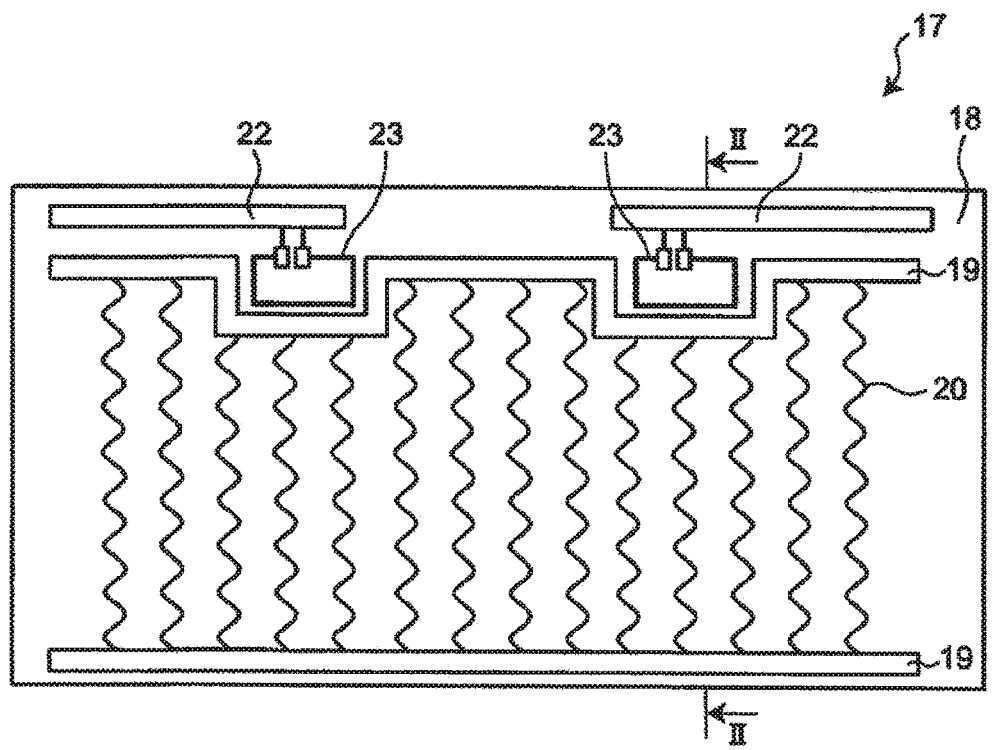
FIG. 3A is a schematic illustration showing one embodiment of the circuit-including film of the present invention.
Figure 3B:
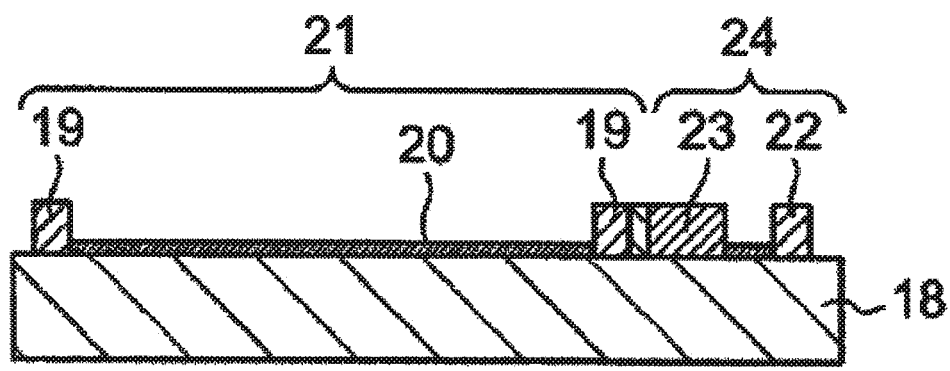
FIG. 3B is a cross-sectional view of the circuit-including film shown in FIG. 3A, which is taken along the line II-II of FIG. 3A.

One embodiment of the circuit-including film of the present invention in which the conductive fine wire circuit (A) has a heating function and the conductive circuit (B) has an antenna function is shown in FIG. 3A. FIG. 3B is a cross-sectional view of the circuit-including film shown in FIG. 3A, which is taken along the line II-II of FIG. 3A. A circuit-including film 17 shown in FIGS. 3A and 3B is provided with: a resin film 18; and a conductive fine wire circuit 21 that has two bus bars 19 and a plurality of wavy line-like conductive fine wires 20 connecting the two bus bars 19 to each other; and a conductive circuit 24 that has two bus bars 22 and two loop-like antennas 23 connecting the two bus bars 22 to each other, both of which are included on one surface of the resin film 18. One of the bus bars 19 which is located on the conductive circuit 24 side has two depressed portions, wherein two loop-like antennas 23 are arranged in the depressed portions, respectively. An electric current can be fed to the bus bars 19 included in the conductive fine wire circuit 21 and the bus bars 22 included in the conductive circuit 24 separately. For example, in the case where a laminated glass provided with the circuit-including film 17 is used as a front glass of a vehicle, the whole area of the front glass can be heated with the conductive fine wire circuit 21 and a radio wave can be received/sent by/from the conductive circuit 24. The length in the longer axis direction of each of the loop-like antennas 23 is preferably 10 to 300 mm, more preferably 30 to 250 mm, still more preferably 50 to 200 mm, and the length in the shorter axis direction may be the same as that in the longer axis direction and is preferably 10 to 250 mm, more preferably 20 to 200 mm, still more preferably 30 to 150 mm. The thickness of each of the loop-like antennas is preferably 5 to 250 μm, more preferably 10 to 150 μm.

Figure 4A:
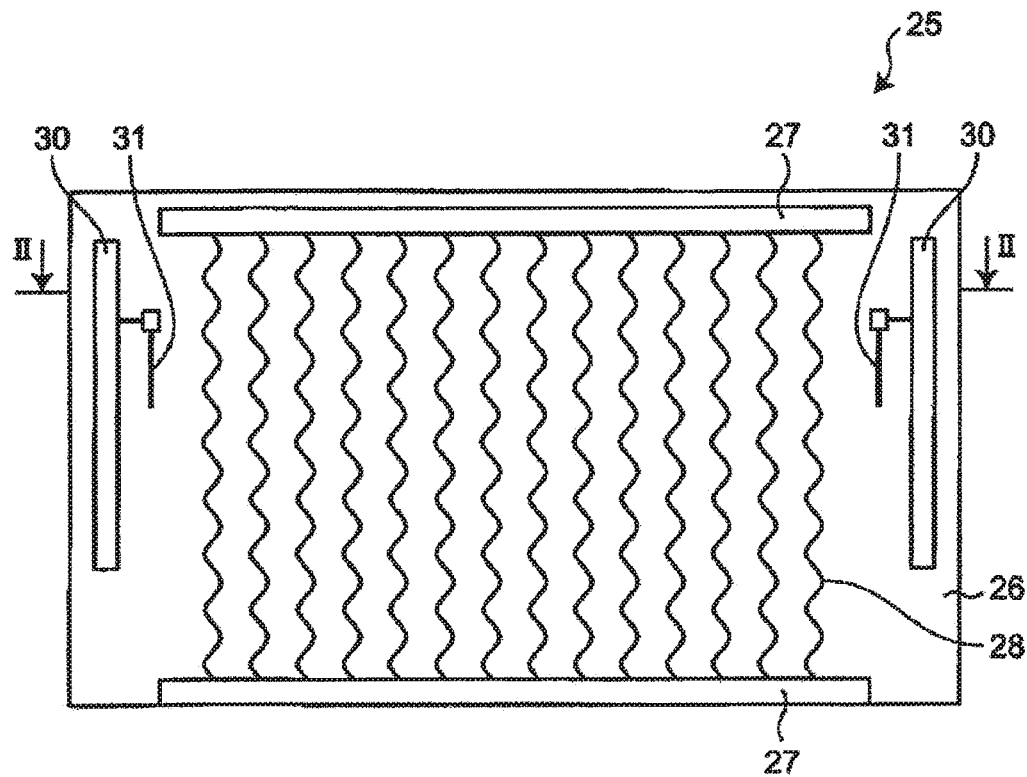
FIG. 4A is a schematic illustration showing one embodiment of the circuit-including film of the present invention.
Figure 4B:
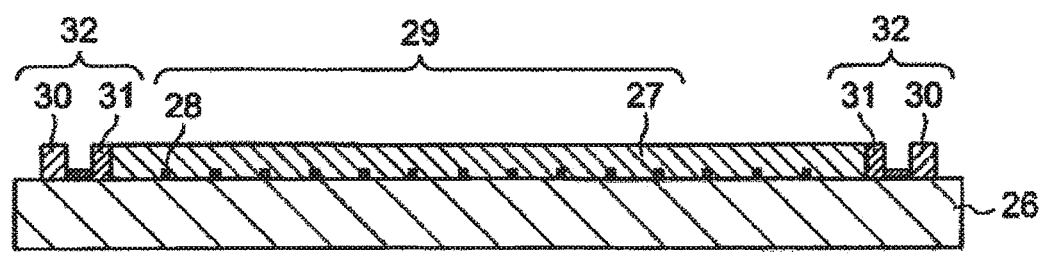
FIG. 4B is a cross-sectional view of the circuit-including film shown in FIG. 4A, which is taken along the line II-II of FIG. 4A.

Another embodiment of the circuit-including film of the present invention in which the conductive fine wire circuit (A) has a heating function and the conductive circuit (B) has an antenna function is shown in FIG. 4A. FIG. 4B is a cross-sectional view of the circuit-including film shown in FIG. 4A, which is taken along the line II-II of FIG. 4A. A circuit-including film 25 shown in FIGS. 4A and 4B is provided with: a resin film 26; and a conductive fine wire circuit 29 that has two bus bars 27 and a plurality of wavy line-like conductive fine wires 28 connecting the two bus bars 27 to each other; and a conductive circuit 32 that has two bus bars 30 and two pole-like antennas 31 connecting the two bus bars 30 to each other, both of which are included on one surface of the resin film 26. Each of the bus bars 27 included in the conductive fine wire circuit 29 and each of the bus bars 30 included in the conductive circuit 32 are arranged in the directions orthogonal to each other. An electric current can be fed to the bus bars 27 included in the conductive fine wire circuit 29 and the bus bars 30 included in the conductive circuit 32 separately. For example, in the case where a laminated glass provided with the circuit-including film 25 is used as a front glass of a vehicle, the whole area of the front glass can be heated with the conductive fine wire circuit 29 and a radio wave can be received/sent by/from the conductive circuit 32. The length (i.e., the length of a linear conductive body or the length in the longer axis direction) of each of the pole-like antennas 31 is required to be about 1/10 or more of the wavelength of a radio wave to be received/sent by/from the antennas. For example, in the case of an antenna for DTVs, the length of each of the pole-like antennas is preferably 50 to 100 mm, more preferably 30 to 90 mm, and the width (i.e., the length in the shorter axis direction) of each of the pole-like antennas 31 is preferably 10 to 50 mm, more preferably 20 to 40 mm. For example, a terminal of an antenna circuit embedded in the laminated glass is drawn to the edge of the laminated glass, and a radio wave can be received by connecting the terminal of the antenna circuit to a receiver. The thickness of each of the pole-like antennas is preferably 5 to 250 μm, more preferably 10 to 150 μm.

<Resin Film (2)>

The circuit-including film of the present invention can comprise further a resin film (2). The resin film (2) is preferably arranged on surfaces of the conductive fine wire circuit (A) and the conductive circuit (B) which are opposed to the resin film (1) or on a surface of the resin film (1) which is opposed to the conductive fine wire circuit (A) and the conductive circuit (B). Namely, in a preferred aspect, the circuit-including film of the present invention may comprise the resin film (1), the conductive fine wire circuit (A) and the conductive circuit (B), and the resin film (2) in this order, or may comprise the resin film (2), the resin film (1), and the conductive fine wire circuit (A) and the conductive circuit (B) in this order. When the circuit-including film of the present invention comprises the resin film (2), the disconnection or deformation of the circuit during the production of a laminated glass can be suppressed or prevented effectively. The resin film (2) may also have a function of reflecting infrared ray, a function of reflecting ultraviolet ray, a function of correcting color, a function of absorbing infrared ray, a function of absorbing ultraviolet ray, a function of emitting fluorescence or light, a function of insulating a sound, an electrochromic function, a thermochromic function, a photochromic function, a decorative function or the like.

Examples of a resin to be contained in the resin film (2) [wherein the resin is also referred to as a "resin (2)"] include a polyvinyl acetal resin, an ionomer resin, an ethylene-(vinyl acetate) copolymer resin, and a styrene-butadiene copolymer resin. Among these resins, the resin film (2) preferably contains at least one resin selected from the group consisting of a polyvinyl acetal resin, an ionomer resin and an ethylene-(vinyl acetate) copolymer resin, from the viewpoint of preventing the detachment or deformation of the circuit during the production of a laminated glass.

As the polyvinyl acetal resin, the same polyvinyl alcohol resins as those described in the section [Resin film (1)] can be used. With respect to the ranges of the acetalization degree, the acetyl group amount and the hydroxyl group amount of the polyvinyl acetal resin, the same ranges can be applied to the polyvinyl acetal resin to be used. When the acetalization degree of the polyvinyl acetal resin constituting the resin film (2) falls within a specified range, a circuit-including film having excellent penetration resistance or excellent adhesiveness to glasses during the production of a laminated glass can be obtained more readily. When the acetyl group amount falls within a specified range, a resin film (2) having excellent compatibility with a plasticizer can be obtained more readily. When the hydroxyl group amount falls within a specified range, a laminated glass having excellent penetration resistance, adhesiveness or sound insulation properties can be produced more readily.

From the viewpoint that satisfactory film formability and laminating suitability can be achieved more readily and the from the viewpoint of reducing the shock against a heat part upon crush in a glass for vehicles which contains the resin film (2), it is preferred to contain an uncrosslinked polyvinyl acetal resin. However, the resin film (2) may also contain a crosslinked polyvinyl acetal resin. The method for crosslinking the polyvinyl acetal resin is the same as that mentioned in the section "Resin film (1)".

As the ionomer resin and the ethylene-(vinyl acetate) copolymer resin, the same resins as those mentioned with in the section "Resin film (1)" can be used.

It is preferred that the resin film (2) contains the polyvinyl acetal resin in an amount of preferably 50% by mass or more, more preferably 70% by mass or more, still more preferably 90% by mass or more, particularly preferably 100% by mass, relative to the mass of the resin film (2). When the content of the polyvinyl acetal resin in the resin film (2) falls within the above-mentioned range, the disconnection, deformation or the like during the production of a laminated glass can be suppressed or prevented more effectively.

The resin film (2) may contain a plasticizer. The content of the plasticizer to be contained in the resin film (2) is preferably 10 to 50% by mass, more preferably 15 to 40% by mass, still more preferably 20 to 30% by mass, relative to the mass of the resin film (2). When the content of the plasticizer falls within the above-mentioned range, a laminated glass having excellent impact resistance can be produced more readily, and the disconnection, deformation or the like of the circuit is not easy to occur even when a mechanical action occurs. As one preferred aspect, the resin film (2) contains a polyvinyl acetal resin in an amount of 50% by mass or more and a plasticizer in an amount of 10 to 50% by mass relative to the mass of the resin film (2).

As the plasticizer, the plasticizer mentioned in the section "Resin film (1)" can be used. The resin film (2) may contain an additive as mentioned in the section "Resin film (1)", if necessary.

It is preferred that the resin (1) contained in the resin film (1) and the resin (2) contained in the resin film (2) are the same resin as each other, and it is also preferred that each of the resin (1) and the resin (2) is a polyvinyl acetal resin. The matter that the resin (1) and the resin (2) are the same as each other is preferred, because the difference in refractive index between the resin film (1) and the resin film (2) become small in an equilibrium state where the plasticizer migrates in the same manner as mentioned below in a laminated glass equipped with the circuit-including film of the present invention and, when a resin (1) and a resin (2) having different dimensions from each other are used, the boundary between these films cannot be visually confirmed easily and the front visibility can be improved.

In the present invention, when each of the resin film (1) and the resin film (2) contains a polyvinyl acetal resin, the difference between the hydroxyl group amount of the polyvinyl acetal resin contained in the resin film (1) and that in the resin film (2) is preferably 4% by mass or less, more preferably 3% by mass or less, particularly preferably 2% by mass or less. When the polyvinyl acetal resin contained in the resin film (1) and/or the polyvinyl acetal resin contained in the resin film (2) comprises a mixture of a plurality of resins, it is preferred that the difference of the hydroxyl group amount of at least one of the polyvinyl acetal resins contained in the resin film (1) and that of at least one of the polyvinyl acetal resins contained in the resin film (2) is equal to or less than the above-mentioned upper limit value. The matter that the difference is equal to or less than the above-mentioned upper limit value is preferred, because the difference in refractive index between the resin film (1) and the resin film (2) become small in an equilibrium state where the plasticizer migrates in the same manner as mentioned below in a laminated glass equipped with the circuit-including film of the present invention and, when a resin (1) and a resin (2) having different dimensions from each other are used, the boundary between these films cannot be visually confirmed easily and the front visibility can be improved. In the present invention, it is also possible to produce a laminated glass in which the above-mentioned boundary cannot be confirmed visually or which has excellent front visibility.

The thickness of the resin film (2) is preferably 100 to 1000 μm, more preferably 200 to 900 μm, still more preferably 300 to 800 μm. When the thickness of the resin film (2) falls within the above-mentioned range, satisfactory penetration resistance can be achieved when a laminated glass is produced using the resin film (2), which is very advantageous from the viewpoint of safety.

The resin film (2) may be produced in the same manner as for the production of the resin film (1) as mentioned in the section "Resin film (1)".

<Method for Producing Circuit-Including Film>

The circuit-including film of the present invention can be produced by a method comprising the steps of (i) forming a conductive fine wire circuit (A) and a conductive circuit (B) on one surface of a resin film (1); and (ii) optionally laminating a resin film (2) on a surface of the resin film (1) which is opposed to the conductive fine wire circuit (A) and the conductive circuit (B) or a surface of the conductive fine wire circuit (A) and the conductive circuit (B) which is opposed to the resin film (1).

In the case where each of the conductive fine wire circuit (A) and the conductive circuit (B) is a circuit having a heating function, it is preferred that the step (i) comprises the steps of bonding the resin film (1) to a metal foil and then forming the conductive fine wire circuit (A) and the conductive circuit (B) from the metal foil-including resin film (1). The step of bonding the resin film (1) to the metal foil can be carried out by, for example, the following method.

A method in which the resin film (1) and the metal foil are thermal press bonded to each other while overlaying the resin film (1) and the metal foil on each other;
a method in which a molten product of a resin composition constituting the resin film (1) is coated on the metal foil so as to bond the metal foil to the resin film (1), for example, a method in which the resin composition is melt-extruded onto the metal foil, or a method in which the resin composition is applied onto the metal foil by application with a knife or the like; or
a method in which a solvent or a solution or dispersion containing a resin constituting the resin film (1) and a solvent is applied onto one surface or both surfaces of the metal foil, or a method in which the solution or dispersion is injected between the metal foil and the resin film (1) to bond the metal foil and the resin film (1) to each other.

The bonding temperature to be employed in the thermal press bonding is determined depending on the type of the resin constituting the resin film (1), and is generally 70 to 170° C., preferably 90 to 160° C., more preferably 100 to 155° C., still more preferably 110 to 150° C. When the bonding temperature falls within the above-mentioned range, satisfactory bonding strength can be achieved more readily. The resin temperature to be employed in the extrusion is preferably 150 to 250° C., more preferably 170 to 230° C., from the viewpoint of reducing the content of a volatile substance in the resin film (1). In order to remove the volatile substance effectively, it is preferred to remove the volatile substance through a vent port of the extruder by the reduction of pressure.

It is also preferred to use a plasticizer that is conventionally used in the resin constituting the resin film (1) as the solvent, and the same plasticizer as mentioned above can be used.

The step of forming the conductive fine wire circuit (A) and the conductive circuit (B) from the metal foil-including resin film (1) is carried out by employing a publicly known photolithographic technique. The step is carried out by, for example, laminating a dry film resist onto the metal foil in the metal foil-including resin film (1), then forming an etching-resistant pattern corresponding to each of the conductive fine wire circuit (A) and the conductive circuit (B) by employing a photolithographic technique, then immersing the resin film (1) having the etching-resistant pattern formed thereon in a copper etching solution to form each of the conductive fine wire circuit (A) and the conductive circuit (B), and then removing the remaining photoresist layer by a publicly known method, as mentioned below in the section "EXAMPLES". According to this production method, a circuit having a desired shape can be formed conveniently and easily, and therefore the efficiency of the production of the circuit-including film can be significantly improved.

In the case where the conductive fine wire circuit (A) is a circuit derived from the metal foil (i.e., a circuit having a heating function) and the conductive circuit (B) is a circuit having an antenna function, it is preferred that the step (i) includes the step of bonding the resin film (1) and the metal foil to each other, the step of forming the conductive fine wire circuit (A) from the metal foil-including resin film (1), and the step of forming the conductive circuit (B) on a conductive fine wire circuit (A)-formed surface of the resin film (1), as mentioned above.

For the step of bonding the resin film (1) and the metal foil to each other, the same method as that employed for the above-mentioned step of bonding the resin film (1) and the metal foil to each other can be employed. For the step of forming the conductive fine wire circuit (A) from the metal foil-including resin film (1), the same method as that employed for the above-mentioned step of forming the conductive fine wire circuit (A) and the conductive circuit (B) from the metal foil-including resin film (1) can be employed, except that an etching-resistant pattern corresponding to the conductive fine wire circuit (A) is used in place of the etching-resistant pattern corresponding to each of the conductive fine wire circuit (A) and the conductive circuit (B).

For the step of forming the conductive circuit (B) on the conductive fine wire circuit (A)-formed surface of the resin film (1), a method in which a self-welding metal wire is pressed against the conductive fine wire circuit (A)-formed surface of the resin film (1) using a number-controlled wiring machine while heating the conductive fine wire circuit (A)-formed resin film (1) and/or the self-welding metal wire can be employed. As the method for heating the self-welding metal wire, high-frequency induction heating, energization and the like can be employed. As the method for heating the resin film (1), high-frequency dielectric heating, ultrasonic heating, hot air heating and the like can be employed. In the case where a number-controlled wiring machine is used, it is preferred to employ a method of heating the resin film (1) rather than the method of heating the self-welding metal wire. In this case, high-frequency dielectric heating or ultrasonic heating is preferred.

<Circuit-Including Film>

The circuit-including film of the present invention may have the resin film (1), the conductive fine wire circuit (A) and the conductive circuit (B), and a layer different from the resin film (2), such as a functional layer or the like.

Examples of the functional layer include an infrared ray reflecting layer, an ultraviolet ray reflecting layer, a color correcting layer, an infrared ray absorbing layer, an ultraviolet ray absorbing layer, a fluorescence or light emitting layer, a sound insulating layer, an electrochromic layer, a thermochromic layer, a photochromic layer, a decorative layer, and a high-elastic-modulus layer. Examples of the layer configuration in the circuit-including film of the present invention include, but are not limited to, the following layer configurations.

<1> A (resin film (1))/(conductive fine wire circuit (A) and conductive circuit (B))/(resin film (2)) three configuration.

<2> A (functional layer)/(resin film (1))/(conductive fine wire circuit (A) and conductive circuit (B))/(resin film (2)) four-layer configuration.

<3> A (resin film (1))/(conductive fine wire circuit (A) and conductive circuit (B))/(functional layer)/(resin film (2)) four-layer configuration.

<4> A (resin film (1))/(conductive fine wire circuit (A) and conductive circuit (B))/(resin film (2))/(functional layer) four-layer configuration.

<5> A (resin film (2))/(resin film (1))/(conductive fine wire circuit (A) and conductive circuit (B)) three-layer configuration.

<6> A (resin film (2))/(resin film (1))/(conductive fine wire circuit (A) and conductive circuit (B))/(resin film (2)) four-layer configuration.

<7> A (functional layer)/(resin film (2))/(resin film (1))/ (conductive fine wire circuit (A) and conductive circuit (B)) four-layer configuration.

<8> A (functional layer)/(resin film (2))/(resin film (1))/ (conductive fine wire circuit (A) and conductive circuit (B))/(resin film (2)) five-layer configuration.

<9> A (resin film (2))/(functional layer)/(resin film (1))/ (conductive fine wire circuit (A) and conductive circuit (B)) four-layer configuration.

<10> A (resin film (2))/(functional layer)/(resin film (1))/ (conductive fine wire circuit (A) and conductive circuit (B))/(resin film (2)) five-layer configuration.

<11> A (resin film (2))/(resin film (1))/(conductive fine wire circuit (A) and conductive circuit (B))/(functional layer) four-layer configuration.

<12> A (resin film (2))/(resin film (1))/(conductive fine wire circuit (A) and conductive circuit (B))/(functional layer)/(resin film (2)) five-layer configuration.

[Laminated Glass]

The laminated glass of the present invention has the circuit-including film between at least two glasses.

The glass is preferably an inorganic glass or an organic glass such as a methacrylic resin sheet, a polycarbonate resin sheet, a polystyrene resin-based resin sheet, a polyester-based resin sheet and a polycycloolefin-based resin sheet, more preferably an inorganic glass, a methacrylic resin sheet or a polycarbonate resin sheet, particularly preferably an inorganic glass, from the viewpoint of transparency, weather resistance and mechanical strength. Examples of the inorganic glass include, but are not limited to, a float glass, a strengthened glass, a semi-strengthened glass, a chemically strengthened glass, a green glass and a silica glass.

In the laminated glass of the present invention, the conductive fine wire circuit (A) and the conductive circuit (B) may be in contact with the glass. In the case where the glass is an inorganic glass, if the circuit is in contact with the glass directly, the sealing of the circuit may be insufficient and, therefore, water may invade to cause the corrosion of the circuit, or air may remain during the production of the laminated glass to cause air bubbles to remain or to cause detachment. Therefore, it is preferred that the circuit is not in contact with the glass in the laminated glass.

Particularly in the case where the laminated glass of the present invention is to be used in a glass for vehicles, particularly a front glass for vehicles, it is preferred to arrange the laminated glass in such a manner that a low-reflectance-treated surface of the circuit faces the occupant side, from the viewpoint of front visibility.

Furthermore, from the viewpoint of avoiding the invasion of water from an edge of the laminated glass to cause the corrosion of the circuit, it is preferred that the circuit is arranged inside by 1 cm or more of an edge of the laminated glass.

In the laminated glass of the present invention, the distance between the circuit and an inside surface of at least one of the glasses is preferably less than 200 µm, more preferably 100 µm or less, still more preferably 50 µm or less. The distance between the circuit and an inside surface of at least one of the glasses is also preferably 10 µm or more, more preferably 20 µm or more, still more preferably 25 µm or more. When the distance between the circuit and an inside surface of at least one of the glasses falls within the above-mentioned range, the efficiency of the heating of a glass surface can be improved and therefore high heat-generating properties can be achieved. In this regard, the term "distance" refers to a distance between a circuit, among the conductive fine wire circuit (A) and the conductive circuit (B), that is closer to an inside surface of the glass and the inside surface of the glass.

In the laminated glass of the present invention, the plasticizer contained in the resin film (1) and/or the resin film (2) generally migrates to the other resin film which does not contain the plasticizer or the other resin film which contains the plasticizer in a relatively smaller amount with the elapse of time. The degree of the migration may vary depending on the amount of the plasticizer contained in the resin film (1) and the resin film (2), the type, viscosity average polymerization degree, acetalization degree, acetyl group amount, hydroxyl group amount or the like of the resin contained in the resin film (1) and the resin film (2). In a preferred aspect, the amount of the plasticizer in the resin film (2) is larger than that in the resin film (1) and, therefore, the plasticizer migrates from the resin film (2) to the resin film (1).

In the laminated glass of the present invention, an average amount of the plasticizer in the resin film (1) and the resin film (2) is 5 to 50% by mass, preferably 10 to 40% by mass, still more preferably 18 to 35% by mass, particularly preferably 20 to 30% by mass, most preferably 22 to 29% by mass.

When the average amount of the plasticizer falls within the above-mentioned range, desired properties of the laminated glass, such as a property that the shock against the head part of an occupant upon crash can be reduced, can be achieved more readily. The average amount of the plasticizer can be calculated after the migration of the plasticizer in accordance with the following formula.

$$\text{Average amount of plasticizer(by mass)} = (A \times a + B \times b)/(a+b) \qquad \text{[Mathematical formula 1]}$$

A (by mass): the amount of the plasticizer in the resin film (1)

a (μm): the thickness of the resin film (1)

B (% by mass): the amount of the plasticizer in the resin film (2)

b (μm): the thickness of the resin film (2)

The average amount of the plasticizer can be adjusted to a value falling within the above-mentioned range by adjusting the amount of the plasticizer to be contained in the resin film (1), the thick of the resin film (1), the amount of the plasticizer to be contained in the resin film (2) and the thickness of the resin film (2).

The interface or boundary between the resin film (1) and the resin film (2) cannot be sometimes visually confirmed after the production of the laminated glass. Particularly in the case where the resin contained in the resin film (1) and the resin contained in the resin film (2) are the same as each other, the difference between the refractive indexes of the resins is small and therefore the interface or boundary cannot be often visually confirmed. However, the laminated glass of the present invention includes, within the scope thereof, all of laminated glasses each having the circuit-including film between at least two glasses. Therefore, the interface or boundary between the resin film (1) and the resin film (2) may be detected visually, or may not be detected visually.

In the laminated glass of the present invention, the total thickness of films and/or layers each containing a polyvinyl acetal resin is preferably less than 1 mm, more preferably 900 μm or less, still more preferably 850 μm or less. The total thickness of the films and/or the layers each containing a polyvinyl acetal resin is also preferably 110 μm or more, more preferably 300 μm or more, still more preferably 500 μm or more. When the thickness of the films and/or the layers each containing a polyvinyl acetal resin falls within the above-mentioned range, satisfactory penetration resistance can be achieved when a laminated glass is produced, which is very advantageous from the viewpoint of safety.

The layer configuration in the laminated glass of the present invention is not particularly limited, and an example of the layer configuration is one in which two gasses are arranged respectively on both sides of, for example, a layer configuration exemplified in the section "Circuit-including film" above as the layer configuration of the circuit-including film of the present invention.

The laminated glass of the present invention comprises the above-mentioned circuit-including film and, therefore, does not undergo the disconnection or detachment of conductive fine wire circuit (A) or the conductive circuit (B), preferably does not undergo the disconnection, detachment and deformation of these circuits. Therefore, the laminated glass has excellent inventiveness. Furthermore, the laminated glass also has a small haze value and therefore has excellent front visibility.

When the laminated glass of the present invention is irradiated with light from the side of a low-reflectance-treated surface (e.g., a blackish-finish-treated surface) thereof, the haze value is generally 2.0 or less, preferably 1.8 or less, more preferably 1.5 or less. When the laminated glass of the present invention is irradiated with light from the side of a metallic glossy surface thereof, the haze value is generally 3.0 or less, preferably 2.8 or less, more preferably 2.5 or less. The haze value can be adjusted to a value falling within above-mentioned upper limit value by adjusting the line width or shape of the circuit appropriately in the manner mentioned in the section [Conductive fine wire circuit (A) and conductive circuit (B)].

The laminated glass of the present invention can be used as a laminated glass in a building or a vehicle. The term "glass for vehicles" as used herein refers to a front glass, a rear glass, a roof glass, a side glass or the like for a vehicle such as a locomotive, an electric train, a motor car, a ship and an airplane.

It is preferred that fine wires of the conductive fine wire circuit (A) and the conductive circuit (B) are not observed visually from the position of an occupant or an observer from the side of a low-reflectance-treated surface (e.g., a blackish-finish-treated surface) of the laminated glass of the present invention. Because the wires are not observed visually, the laminated glass of the present invention can be used suitably particularly in a use application for which satisfactory front visibility is required, such as in a front glass for vehicles. The visibility of each of the conductive fine wire circuit (A) and the conductive circuit (B) can be evaluated sensorily.

The laminated glass of the present invention can be produced by a method known by a person skilled in the art. For example, the laminated glass can be produced by placing the circuit-including film on a glass, then further placing another glass on the circuit-including film to produce a laminated product, then rising the temperature of the laminated product as a preliminary press bonding step to fuse the circuit-including film entirely or partially onto the glass, and then treating the resultant produce with an autoclave.

For achieving the preliminary press bonding step, a method in which deaeration is carried out under reduced pressure with a vacuum bag, a vacuum ring or a vacuum laminator, a method in which deaeration is carried out with a nip roll, a method in which compression molding is carried out under a high temperature, and others can be employed, from the viewpoint of removing excessive air or performing temporary bonding of an adjacent film or circuit. For example, the vacuum bag method or the vacuum ring method described in EP 1235683 B1 can be carried out, for example, at about $2 \times 10^4$ Pa and at 130 to 145° C.

A vacuum laminator is composed of a chamber that can be heated and can be vacuated, and the laminated glass can be produced in the chamber within a period of time of about 20 to about 60 minutes. In general, a reduced pressure of 1 to $3 \times 10^4$ Pa and a temperature of 100 to 200° C., particularly 100 to 160° C. are effective. In the case where a vacuum laminator is used, the treatment with an autoclave may not be carried out depending on the temperature or pressure to be employed. The treatment with an autoclave can be carried out, for example, at a pressure of about $1 \times 10^6$ to about $1.5 \times 10^6$ Pa and a temperature of about 100° C. to about 145° C. for about 20 minutes to about 2 hours.

EXAMPLES

Hereinbelow, the present invention will be described with reference to examples and a comparative example. However, the present invention is not intended to be limited by the following examples. The measurement methods for various evaluations are as follows.

<Measurement of Viscosity of Resin>

A solution was prepared, in which 10 parts by mass of a resin film (1) was dissolved in 90 parts by mass of a 1/1 (by mass) toluene/ethanol mixed solution. The viscosity of the solution was measured with a Brookfield type (B-type) viscometer under the conditions of 20° C. and 30 rpm.

<Evaluation of Disconnection and Deformation after Production of Laminated Glass>

Four laminated glasses were produced in accordance with Examples and Comparative Example. In each of the laminated glasses, the state of a metal fine wire in a conductive fine wire circuit (A) which was in contact with a bus bar end part was observed with naked eyes using a loupe, and the presence or absence of disconnection or deformation of the metal fine wire was evaluated in accordance with the following criteria. The results are shown in Table 2.

A: Deformation or disconnection were not observed.

B: Partial deformation was observed, but disconnection was not observed.

C: Disconnection was observed.

<Measurement of Haze Value>

In Examples and Comparative Example, laminated glasses were produced, in each of which a glass to be used was replaced by another glass having a size of 5 cm long, 5 cm wide and 3 mm thick. With respect to each of the laminated glasses, a haze value when the laminated glass was irradiated with light from the side of a blackish-finish-treated surface of the laminated glass and a haze value when the laminated glass was irradiated with light from the side of a metallic glossy surface of the laminated glass were measured with a haze meter in accordance with JIS R3106. The results are shown in Table 2.

<Sensory Evaluation of Visibility of End Part of Resin Film (1)>

Each of the laminated glasses obtained in Examples and Comparative Example was allowed to stand at room temperature for 2 weeks, and then whether or not an end part of a resin film (1) was detected with naked eyes was evaluated sensorily in accordance with the following criteria. The results are shown in Table 2.

A: The end part was not detected at all, and therefore the visibility was quite good.

B: The end part was partly detected, but the visibility was good.

C: The end parts was detected, but the visibility was practically acceptable.

In the regard, the wording "the end part was not detected" refers to the matter that the boundary between a resin film (1) and a resin film (2) was not detected visually. In other words, the wording means that the viewability of a space on the rear side of the glass surface was excellent and therefore the front visibility was satisfactory.

Production Example 1

A polyvinyl butyral resin 1 (also referred to as a "resin 1", hereinafter) and a polyvinyl butyral resin 2 (also referred to as a "resin 2", hereinafter) were melt-kneaded with each other at an amount ratio of 75:25 by mass. In the case where a polyvinyl acetal resin film contained a plasticizer, a specific amount of triethylene glycol-bis-(2-ethylhexanoate) (abbreviated as "3GO", hereinafter) was also melt-kneaded as a plasticizer together with the resin 1 and the resin 2. Subsequently, a melt-kneaded product thus produced was extruded in a strand-like shape and was then pelletized into pellets. The pellets thus produced were melt-extruded with a single-screw extruder and a T-die, and then the resultant product was processed with a metallic elastic roll to produce a polyvinyl acetal resin film PVB-a having a smooth surface and a thickness of 50 μm. In the same manner, polyvinyl acetal resin films PVB-b and PVB-c having thicknesses of 15 μm and 300 μm, respectively, were also produced. In addition, a polyvinyl acetal resin film PVB-d having a thickness of 50 μm and containing a plasticizer at a content of 15% by mass relative to the mass of the film (i.e., the total amount of the resin and the plasticizer) was also produced. Separately, the resin 1 and the resin 2 were melt-kneaded at an amount ratio of 25:75 by mass, then the resultant melt-kneaded product was extruded into a strand-like shape, and then the strand-like product was pelletized into pellets. The pellets thus produced were melt-extruded with a single-screw extruder and a T-die, and then the resultant product was processed with a metallic elastic roll to produce a polyvinyl acetal resin film PVB-e having a smooth surface and a thickness of 50 μm. The physical properties of the resin 1 and the resin 2 both used in the production of the polyvinyl acetal resin films PVB-a to PVB-e are shown in Table 1. Each of mixtures of the resin 1 and the resin 2 used in the production of PVB-a to PVB-d had a viscosity of 245 mPa·s. A mixture of the resin 1 and the resin 2 used in the production of PVB-e had a viscosity of 783 mPa·s.

TABLE 1

| Resin | Hydroxyl group amount (% by mass) | Acetalization degree (% by mass) | Acetyl group amount (% by mass) | Viscosity [mPa · s] |
|---|---|---|---|---|
| 1 | 19.8 | 79.2 | 1.0 | 152 |
| 2 | 20.1 | 79.0 | 0.9 | 1410 |

Production Example 2

An ionomer resin film was produced in the same manner as in Production Example 1, except that an ionomer film ("SentryGlas® Interlayer", manufactured by Kuraray Co., Ltd.) was used in place of the polyvinyl butyral resin. The ionomer resin film thus produced had a thickness of 50 μm.

Example 1

<Production of Circuit-Including Film>

A copper foil which had a thickness of 7 μm and in which one surface was blackish-finish-treated was overlaid on the polyvinyl acetal resin film PVB-a produced in Production Example 1 and having a thickness of 50 μm in such a direction that a surface that was blackish-finish-treated (also referred to as a "blackish-finish-treated surface", hereinafter) of the copper foil came into contact with the resin film (1). The visible light reflectance of the blackish-finish-treated surface as measured in accordance with JIS R 3106 was 5.2%. Subsequently, a laminate produced by overlaying the resin film (1) and the copper foil on each other was intercalated between two PET films each having a thickness of 50 μm, then the resultant product was allowed to pass between thermal press rolls adjusted to 120° C. (pressure: 0.2 MPa, speed: 0.5 m/min), and then the two PET films were detached to produce a resin film (1) having the copper foil bonded thereto.

Subsequently, a dry film resist was laminated on the copper foil in the copper-foil-bonded resin film (1), then etching-resistant patterns respectively corresponding to a conductive fine wire circuit (A) and a conductive circuit (B) that was independent of the conductive fine wire circuit (A) were formed by a photolithographic technique, then the resultant product was immersed in a copper etching solution, and then a remaining photoresist layer was removed by the conventional method. In this manner, a circuit-including film in which the conductive fine wire circuit (A) and the conductive circuit (B) independent of the conductive fine wire circuit (A) were formed on one surface of the resin film (1) was produced. Each of the conductive fine wire circuit (A) and the conductive circuit (B) had a structure that copper wires each having a line width of 8 µm were arranged at 2500-µm intervals in a 5-cm square to form a wavy line-like form and each of the upper side and the lower side of the wavy line-like form is connected to a 5 mm-wide copper wire structure corresponding to a bus bar. The thickness of each of the conductive fine wire circuit (A) and the conductive circuit (B) was 7 µm. The shortest distance between the conductive fine wire circuit (A) and the conductive circuit (B) was 0.8 cm. Each of the conductive fine wire circuit (A) and the conductive circuit (B) had a heating function. The forms and arrangements of the resin film (1) and the conductive fine wire circuit (A) and the conductive circuit (B) were as shown in FIGS. 1A and 1B. The conductive fine wire circuit (A) corresponds to a conductive fine wire circuit 5 in FIGS. 1A and 1B, the conductive circuit (B) corresponds to a conductive circuit 8 in FIGS. 1A and 1B, and the resin film (1) corresponds to a resin film 2 in FIGS. 1A and 1B.

<Production of Laminated Glass>

A circuit-including film having a conductive fine wire circuit (A) and a conductive circuit (B) on one surface of a resin film (1) was placed on a glass having a length of 10 cm, a width of 10 cm and a thickness of 3 mm in such a manner that a surface of the circuit-including film, which had the conductive fine wire circuit (A) and the conductive circuit (B) formed thereon, took an upturn, then a resin film (2) having a length of 10 cm, a width of 10 cm and a thickness of 0.76 mm was overlaid on the resultant product, then a glass having a length of 10 cm, a width of 10 cm and a thickness of 3 mm was further overlaid, and then the resultant product was tied up with a tape. The conductive fine wires in the conductive fine wire circuit were arranged at the center parts of the glasses, and the bus bars are arranged so as to protrude outside the edge parts of the glasses. The laminate thus produced was placed in a vacuum bag, was then treated at 100° C. for 30 minutes under reduced pressure, and was then cooled, then the reduction in pressure was released to produce a laminated glass that was pre-laminated, and the resultant laminated glass was removed. The laminated glass was placed in an autoclave and was then treated at 140° C. and 1.2 MPa for 30 minutes to produce a laminated glass having the glass/the resin film (1)/the conductive fine wire circuit (A) and the conductive circuit (B)/the resin film (2)/the glass in this order.

The resin film (2) (referred to as "PVBF-A"): an intermediate film for an automotive front glass, the content of a polyvinyl butyral resin: 72% by mass, the content of 3GO: 28% by mass, the hydroxyl group amount in the polyvinyl butyral resin: 20.0% by mass, the viscosity average polymerization degree: 1700.

Example 2

A circuit-including film and a laminated glass were produced in the same manner as in Example 1, except that each of the conductive fine wire circuit (A) and the conductive circuit (B) had such a copper mesh structure that copper wires each having a line width of 8 µm were arranged at 500-µm intervals in a 5-cm square to form a grid-like form and each of the upper side and the lower side of the grid-like form is connected to a 5 mm-wide copper wire structure corresponding to a bus bar.

Example 3

A circuit-including film and a laminated glass were produced in the same manner as in Example 1, except that each of the conductive fine wire circuit (A) and the conductive circuit (B) had a structure that copper wires each having a line width of 8 µm were arranged at 2500-µm intervals in a 5-cm square to form a straight line-like form and each of the upper side and the lower side of the grid-like form is connected to a 5 mm-wide copper wire structure corresponding to a bus bar.

Example 4

A circuit-including film and a laminated glass were produced in the same manner as in Example 1, except that a polyvinyl acetal resin film PVB-b having a thickness of 15 µm was used in place of the polyvinyl acetal resin film PVB-a having a thickness of 50 µm.

Example 5

A circuit-including film and a laminated glass were produced in the same manner as in Example 1, except that a polyvinyl acetal resin film PVB-c having a thickness of 300 µm was used in place of the polyvinyl acetal resin film PVB-a having a thickness of 50 µm.

Example 6

A circuit-including film and a laminated glass were produced in the same manner as in Example 1, except that PVB-d was used in place of the polyvinyl acetal resin film PVB-a having a thickness of 50 µm.

Example 7

A circuit-including film and a laminated glass were produced in the same manner as in Example 1, except that a conductive fine wire circuit (A) and a conductive circuit (B) were formed in the following manner.

A UV-curable nano silver ink was printed at a thickness of 10 µm in the inside of a 5-cm square in the resin film (1) produced in Production Example 1 by a typographic method to form a conductive fine wire circuit (A) and a conductive circuit (B). In each of the conductive fine wire circuit (A) and the conductive circuit (B), silver wires each having a line width of 10 µm were arranged at 2500-µm intervals to form a wavy line-like structure and formed a wiring pattern (conductive structure) having a length of 5 cm and composed of 20 wiring lines. The wiring patter (conductive structure) thus produced was irradiated with UV light to cure the ink.

Example 8

A circuit-including film and a laminated glass were produced in the same manner as in Example 1, except that a conductive fine wire circuit (A) and a conductive circuit (B) were formed in the below-mentioned manner and the forms and arrangements of a resin film (1), the conductive fine wire circuit (A) and the conductive circuit (B) were as shown in FIGS. 3A and 3B. The conductive fine wire circuit (A) corresponds to a conductive fine wire circuit 21 in FIGS. 3A and 3B, the conductive circuit (B) corresponds to a conductive circuit 24 in FIGS. 3A and 3B, and the resin film (1) corresponds to a resin film 18 in FIGS. 3A and 3B.

A dry film resist was laminated on a copper foil in a resin film (1) having the copper foil bonded thereto, and then a conductive fine wire circuit (A), which had a structure that copper wires each having a line width of 8 µm are arranged at 2500-μm intervals to form a wavy line-like structure and each of the upper side and the lower side was connected to a 5 mm-wide copper wire structure corresponding to a bus bar, was formed in the inside of a 5-cm square by a photolithographic technique. Subsequently, a polyvinyl butyral resin-coated copper wire which had a circle-like cross-sectional shape having a diameter of 40 μm (the thickness of a polyvinyl butyral resin coating film: 5 μm, the diameter of a copper wire: 30 μm) that served as a self-welding metal wire was pressed against a conductive fine wire circuit (A)-formed surface of a resin film (1), which had a conductive fine wire circuit (A) formed on one surface thereof, with a number-controlled wiring machine while heating the conductive fine wire circuit (A) by a high-frequency dielectric heating method at 70 kHz. In this manner, a loop-like antenna in which the cross section of the resin film (1) had an approximately rectangular shape as observed in the in-plane direction and the length of a longer axis of the resin film (1) was 10 mm as observed in the planar direction was formed as a conductive circuit (B). The shortest distance between the conductive fine wire circuit (A) and the conductive circuit (B) was 0.8 cm, and the thickness of the conductive circuit (B) was 25 μm.

Example 9

A circuit-including film and a laminated glass were produced in the same manner as in Example 1, except that the ionomer resin film produced in Production Example 2 was used in place of the polyvinyl acetal resin film PVB-a having a thickness of 50 μm.

Example 10

A circuit-including film and a laminated glass were produced in the same manner as in Example 1, except that a polyvinyl acetal resin film PVB-e having a thickness of 50 μm was used in place of the polyvinyl acetal resin film PVB-a.

Comparative Example 1

An acrylic adhesive agent was applied onto a PET film (thickness: 50 μm), and then a 7 μm-thick copper foil in which one surface was blackish-finish-treated was overlaid on the PET film in such a manner that a surface that was blackish-finish-treated (also referred to as a "blackish-finish-treated surface", hereinafter) of the copper foil came into contact with the PET film. In this manner, a PET film having the copper foil bonded thereto was produced. A circuit-including film and a laminated glass were produced in the same manner as in Example (1), except that the PET film having the copper foil bonded thereto was used in place of the resin film (1) having the copper foil bonded thereto.

With respect to Examples and Comparative Example, the results of the sensory evaluation of the visibility of an edge part of the resin film (1), the evaluation of the disconnection and deformation after the production of the laminated glass and the measurement of haze values are shown in Table 2.

TABLE 2

| | Resin film (1) | | | Conductive fine wire circuit (A) | | | | |
|---|---|---|---|---|---|---|---|---|
| | Resin film | Thickness | Amount of plasticizer [% by mass] | Conductive material | Shape | Line width [μm] | Pitch width [μm] | Thickness [μm] |
| Example 1 | PVB-a | 50 | 0 | Copper | Wavy line-like | 8 | 2500 | 7 |
| Example 2 | PVB-a | 50 | 0 | Copper | Grid-like | 8 | 500 | 7 |
| Example 3 | PVB-a | 50 | 0 | Copper | Straight line-like | 8 | 2500 | 7 |
| Example 4 | PVB-b | 15 | 0 | Copper | Wavy line-like | 8 | 2500 | 7 |
| Example 5 | PVB-c | 300 | 0 | Copper | Wavy line-like | 8 | 2500 | 7 |
| Example 6 | PVB-d | 50 | 15 | Copper | Wavy line-like | 8 | 2500 | 7 |
| Example 7 | PVB-a | 50 | 0 | Silver | Wavy line-like | 10 | 2500 | 10 |
| Example 8 | PVB-a | 50 | 0 | Copper | Wavy line-like | 8 | 2500 | 7 |
| Example 9 | Ionomer | 50 | 0 | Copper | Wavy line-like | 8 | 2500 | 7 |
| Example 10 | PVB-e | 50 | 0 | Copper | Wavy line-like | 8 | 2500 | 7 |
| Comparative Example 1 | PET | 50 | 0 | Copper | Wavy line-like | 8 | 2500 | 7 |

| | Conductive circuit (B) Function | Resin film (2) | Evaluation of disconnection/ deformation | Evaluation of end part visibility | Haze value of laminated glass | |
|---|---|---|---|---|---|---|
| | | | | | Irradiated from blackish-finish-treated surface side | Irradiated from metallic glossy surface side |
| Example 1 | Heating | PVBF-a | A | A | 1.1 | 2.2 |
| Example 2 | Heating | PVBF-a | A | A | 1.2 | 2.1 |
| Example 3 | Heating | PVBF-a | A | A | 1.1 | 2.0 |
| Example 4 | Heating | PVBF-a | B | A | 1.0 | 2.1 |
| Example 5 | Heating | PVBF-a | A | A | 1.3 | 2.2 |
| Example 6 | Heating | PVBF-a | A | A | 1.2 | 2.0 |
| Example 7 | Heating | PVBF-a | A | A | 1.1 | 2.0 |
| Example 8 | Antenna | PVBF-a | A | A | 1.1 | 2.0 |
| Example 9 | Heating | PVBF-a | B | B | 1.3 | 2.3 |
| Example 10 | Heating | PVBF-a | B | A | 1.2 | 2.2 |
| Comparative Example 1 | Heating | PVBF-a | C | C | 2.7 | 3.9 |

As shown in Table 2, with respect to the circuit-including films produced in Examples 1 to 10, it was confirmed that disconnection did not occur during the production of the laminated glasses. Particularly with respect to the circuit-including films produced in Examples 1 to 3 and 5 to 8, it was confirmed that disconnection did not occur and deformation did not occur, either. In contrast, with respect to the circuit-including film produced in Comparative Example 1, it was confirmed that disconnection occurred during the production of a laminated glass.

Furthermore, each of the laminated glasses produced in Examples 1 to 10 had a smaller haze value and was superior in the visibility of an edge part of the resin film (1) compared with Comparative Example 1, and therefore was confirmed to have excellent front visibility.

DESCRIPTION OF REFERENCE SIGNS 1, 9, 17, 25: Circuit-including film
2, 10, 18, 26: Resin film
3, 6, 11, 14, 19, 22, 27, 30: Bus bar
4, 7, 12, 15, 20, 28: Conductive fine wire
5, 13, 21, 29: Conductive fine wire circuit
8, 16, 24, 32: Conductive circuit
23: Loop-like antenna
31: Pole-like antenna

The invention claimed is:

1. A circuit-including film comprising:
a resin film (1); and
a conductive fine wire circuit (A) and a conductive circuit (B) independent of the conductive fine wire circuit (A), which are arranged on one surface of the resin film (1),
wherein the resin film (1) contains at least one resin selected from the group consisting of a polyvinyl acetal resin, an ionomer resin and an ethylene-(vinyl acetate) copolymer resin, and
wherein, when 10 parts by mass of the resin film (1) is dissolved in 90 parts by mass of a 1/1 (by mass) toluene/ethanol mixed solution to prepare a solution, the solution has a viscosity of 400 mPa·s or less as measured with Brookfield-type (B-type) viscometer at 20° C., 30 rpm.

2. The circuit-including film according to claim 1, wherein the conductive fine wire circuit (A) and/or the conductive circuit (B) are/is a circuit derived from a metal foil.

3. The circuit-including film according to claim 1, wherein the conductive fine wire circuit (A) has a thickness of 1 to 30 μm.

4. The circuit-including film according to claim 1, wherein the conductive circuit (B) has a heating function.

5. The circuit-including film according to claim 1, wherein the conductive circuit (B) has a function of an antenna or a sensor.

6. The circuit-including film according to claim 1, wherein the resin film (1) contains a polyvinyl acetal resin in an amount of 50% by mass or more relative to the mass of the resin film (1).

7. The circuit-including film according to claim 6, wherein the resin film (1) contains a plasticizer in an amount of 0 to 20% by mass relative to the mass of the resin film (1).

8. The circuit-including film according to claim 6, wherein, when 10 parts by mass of the resin film (1) is dissolved in 90 parts by mass of a 1/1 (by mass) toluene/ethanol mixed solution to prepare a solution, the solution has a viscosity of 100 mPas or more as measured with a Brookfield-type (B-type) viscometer at 20° C., 30 rpm.

9. The circuit-including film according claim 1, wherein the resin film (1) has a thickness of 10 to 350 μm.

10. The circuit-including film according to claim 1, wherein the conductive fine wire circuit (A) is made from copper or silver.

11. The circuit-including film according to claim 1, wherein the conductive fine wire circuit (A) is wholly or partly formed in a linear, grid-like, net-like or ghostleg-lottery-like shape.

12. The circuit-including film according to claim 1, wherein the conductive fine wire circuit (A) has a line width of 1 to 30 μm.

13. The circuit-including film according to claim 1, wherein the circuit-including film further comprises a resin film (2).

14. The circuit-including film according to claim 13, wherein the resin film (2) contains a polyvinyl acetal resin in an amount of 50% by mass or more and a plasticizer in an amount of 10 to 50% by mass relative to the mass of the resin film (2).

15. The circuit-including film according to claim 13, wherein the resin film (1), the conductive fine wire circuit (A) and the conductive circuit (B), and the resin film (2) are arranged in this order.

16. The circuit-including film according to claim 13, wherein the resin film (2), the resin film (1), and the conductive fine wire circuit (A) and the conductive circuit (B) are arranged in this order.

17. A laminated glass comprising:
at least two glasses; and
the circuit-including film according to claim 13 between the at least two glasses,
wherein an average amount of the plasticizer in the resin film (1) and the resin film (2) is 5 to 50% by mass.

* * * * *